United States Patent
Chayat

(10) Patent No.: US 11,909,089 B2
(45) Date of Patent: Feb. 20, 2024

(54) SUBSTRATE INTEGRATED WAVEGUIDE (SIW) INCLUDING FENCES WITH WALL STRIPS AND RIDGE STRIPS, WHERE THE RIDGE STRIPS EXTEND FURTHER INTO THE SIW THAN THE WALL STRIPS

(71) Applicant: VAYYAR IMAGING LTD., Yehud (IL)

(72) Inventor: Naftali Chayat, Kfar Saba (IL)

(73) Assignee: VAYYAR IMAGING LTD., Yehud (IL)

( * ) Notice: Subject to any disclaimer, the term of this patent is extended or adjusted under 35 U.S.C. 154(b) by 0 days.

(21) Appl. No.: 17/947,347

(22) Filed: Sep. 19, 2022

(65) Prior Publication Data

US 2023/0011894 A1  Jan. 12, 2023

Related U.S. Application Data

(63) Continuation of application No. 17/347,649, filed on Jun. 15, 2021, now Pat. No. 11,450,937.

(30) Foreign Application Priority Data

Dec. 20, 2020  (IL) .......................................... 279603

(51) Int. Cl.
*H01P 3/12* (2006.01)
*H05K 1/02* (2006.01)
(Continued)

(52) U.S. Cl.
CPC ............ *H01P 3/121* (2013.01); *H01P 1/2088* (2013.01); *H01P 3/123* (2013.01); *H05K 1/0237* (2013.01);
(Continued)

(58) Field of Classification Search
CPC ......... H01P 1/2088; H01P 3/121; H01P 3/123
(Continued)

(56) References Cited

U.S. PATENT DOCUMENTS 5,382,931 A * 1/1995 Piloto et al. .......... H01P 1/2002
333/248
5,389,943 A  2/1995 Brommer et al.
(Continued)

FOREIGN PATENT DOCUMENTS

CN  112072249 A  12/2020

OTHER PUBLICATIONS

Akunuru et al. "Excitation of Circularly Polarized Wave In Substrate Integrated E-Plane Waveguide" In 2019 IEEE International Symposium on Antennas and Propagation and USNC-URSI Radio Science Meeting Jul. 7, 2019 (pp. 1777-1778). IEEE.
(Continued)

*Primary Examiner* — Benny T Lee
(74) *Attorney, Agent, or Firm* — Mark Cohen; Pearl Cohen; Zedek Latzer Baratz

(57) ABSTRACT

A printed circuit board is provided, comprising a horizontally extending dielectric substrate and a substrate integrated waveguide (SIW) having at least one ridge. The SIW comprises two horizontally disposed conductive ground planes spaced by a vertical distance, and two vertically disposed conductive fences spanning therebetween. The fences extend in a first horizontal direction, and are spaced from one another in a second horizontal direction, perpendicular to the first horizontal direction. At least one of the fences comprises a plurality of horizontally disposed conductive strips vertically spaced from one another and extending in the first horizontal direction. At least some of
(Continued)

the conductive strips are ridge-strips constituting the ridge and extending in the second horizontal direction toward the other of the fences.

10 Claims, 13 Drawing Sheets

(51) Int. Cl.
    *H05K 1/11*     (2006.01)
    *H01P 1/208*     (2006.01)
    *H01P 3/123*     (2006.01)

(52) U.S. Cl.
    CPC ... *H05K 1/115* (2013.01); *H05K 2201/09618* (2013.01)

(58) Field of Classification Search
    USPC .................................................. 333/212, 248
    See application file for complete search history.

(56) References Cited

U.S. PATENT DOCUMENTS

| | | | |
|---|---|---|---|
| 6,927,653 B2* | 8/2005 | Uchimura et al. | H01P 1/2088 333/248 |
| 11,450,937 B2* | 9/2022 | Chayat | H01Q 21/005 |
| 2005/0180678 A1 | 8/2005 | Panepucci et al. | |
| 2008/0150821 A1 | 6/2008 | Koch et al. | |
| 2011/0018657 A1 | 1/2011 | Cheng et al. | |
| 2013/0265732 A1 | 10/2013 | Herbsommer et al. | |
| 2016/0204514 A1 | 7/2016 | Miraftab et al. | |

OTHER PUBLICATIONS

Belenguer et al. "Empty substrate integrated waveguide technology for E plane highfrequency and high-performance circuits" Radio Science. Apr. 12, 2017;52(1):49-69.
Belenguer et al. "Empty SIW technologies: A major step toward realizing low-cost and low-loss microwave circuits" IEEE microwave magazine. Feb. 7, 2019;20(3):24-45.
Bozzi et al. "Efficient analysis and experimental verification of substrate-integrated slab waveguides for wideband microwave applications" International Journal of RF and Microwave Computer-Aided Engineering: Co-sponsored by the Center for Advanced Manufacturing and Packaging of Microwave, Optical, and Digital Electronics (CAMPmode) at the University of Colorado at Boulder. May 2005;15(3):296-306.
Coves et al. "A novel band-pass filter based on a periodically drilled SIW structure" AGU Publications, 2016.
Djerafi et al. "Substrate integrated waveguide antennas" Handbook of Antenna Technologies. Sep. 2015:1585-655.
Fujino et al. "Loss reduction by air-region insertion to rectangular waveguide-fed oversized post-wall waveguide slot array antenna in the millimeter-wave band" In 2012 Asia Pacific Microwave Conference Proceedings Dec. 4, 2012 (pp. 887-889). IEEE.
Gu et al. "Substrate intergrated E-plane horn antenna" In 2016 IEEE International Symposium on Antennas and Propagation (APSURSI) Jun. 26, 2016 (pp. 1555-1556). IEEE.
Gu et al. "Substrate-integrated E-plane waveguide horn antenna and antenna array" IEEE Transactions on Antennas and propagation. Mar. 9, 2018;66(5):2382-91.
Hedin et al. "Substrate Integrated E-Plane Waveguide (SIEW) to Design E-Plane and Dual Polarized Devices" IEEE Transactions on Antennas and Propagation. Dec. 7, 2018;67(3):1844-53.
Huang et al. "Concept of substrate integrated E-plane waveguide and waveguide filter" In 2016 International Workshop on Antenna Technology (iWAT) Feb. 2016 (pp. 196-199). IEEE.
International Search Report for PCT Application No. PCT/IL2021/051511 dated Mar. 16, 2022.
Malherbe JA. "Nonradiative dielectric waveguide with perforated dielectric strip" Electronics letters. Feb. 28, 2005;41(4):194-6.
Mallahzadeh et al. "Wideband H-plane horn antenna based on ridge substrate integrated waveguide (RSIW)" IEEE Antennas and Wireless Propagation Letters. Jan. 16, 2012;11:85-8.
Patrovsky et al. "Substrate integrated image guide (SIIG)—a planar dielectric waveguide technology for millimeter-wave applications" IEEE transactions on Microwave Theory and Techniques. Jun. 19, 2006;54(6):2872-9.
Search Report for Israel Patent Application No. 279603 dated Apr. 27, 2021.
She et al. "LTCC oversized rectangular waveguide slot array antenna with air-layer in the radiating part in the millimeter-wave band" IEEE transactions on antennas and propagation. Dec. 31, 2012;61(4):1777-83.
She et al. "LTCC oversized rectangular waveguide slot array antenna with air layers" IEEE Transactions on Antennas and Propagation. Sep. 16, 2015;63(12):5850-4.
"Substrateintegrated waveguide" In Wikipedia, The Free Encyclopedia, Oct. 4, 2020; Retrieved Jun. 23, 2022 at: url: https://en.wikipedia.org/w/index.php?title=Substrateintegrated_waveguide&oldid=981809257.

\* cited by examiner

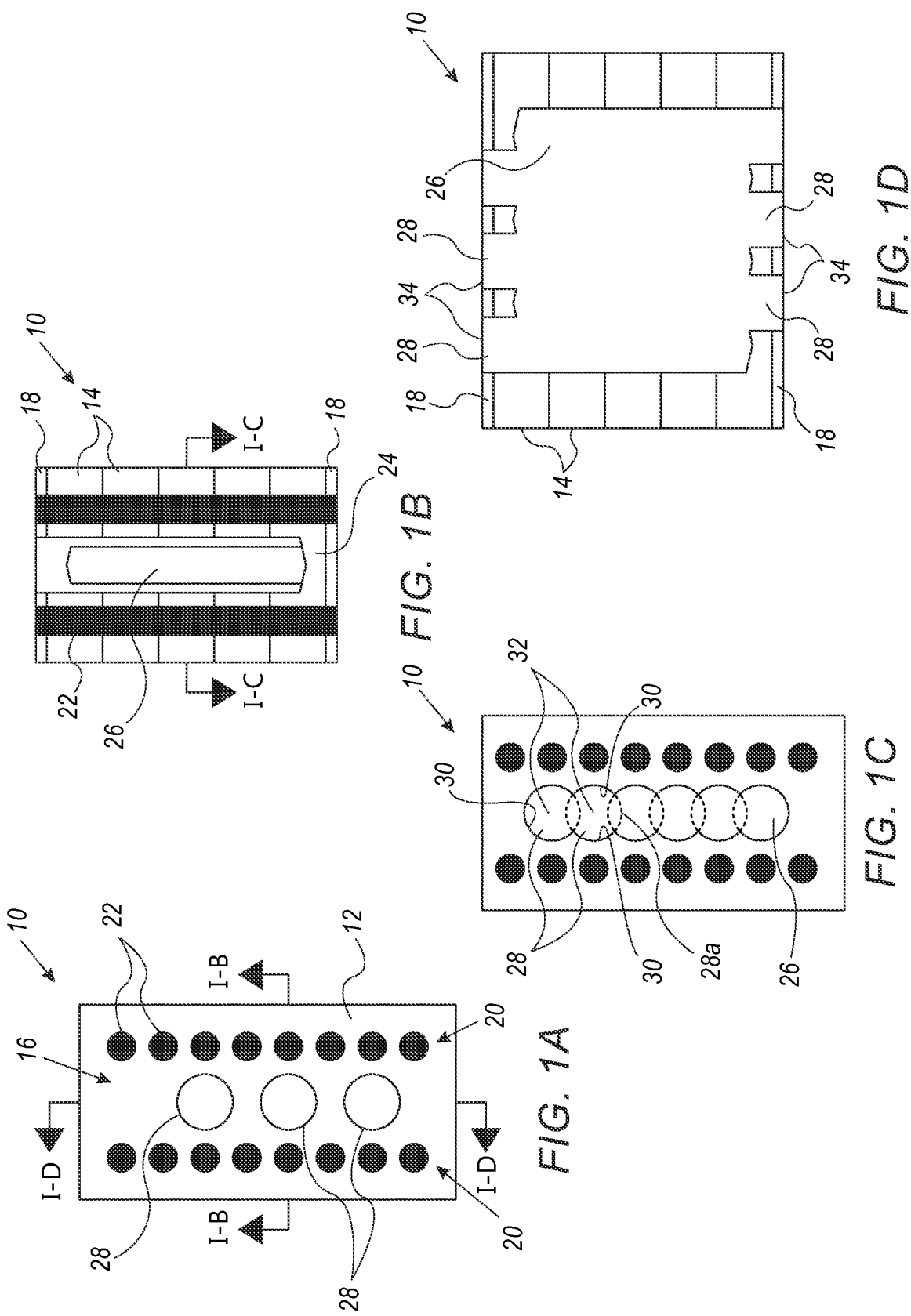

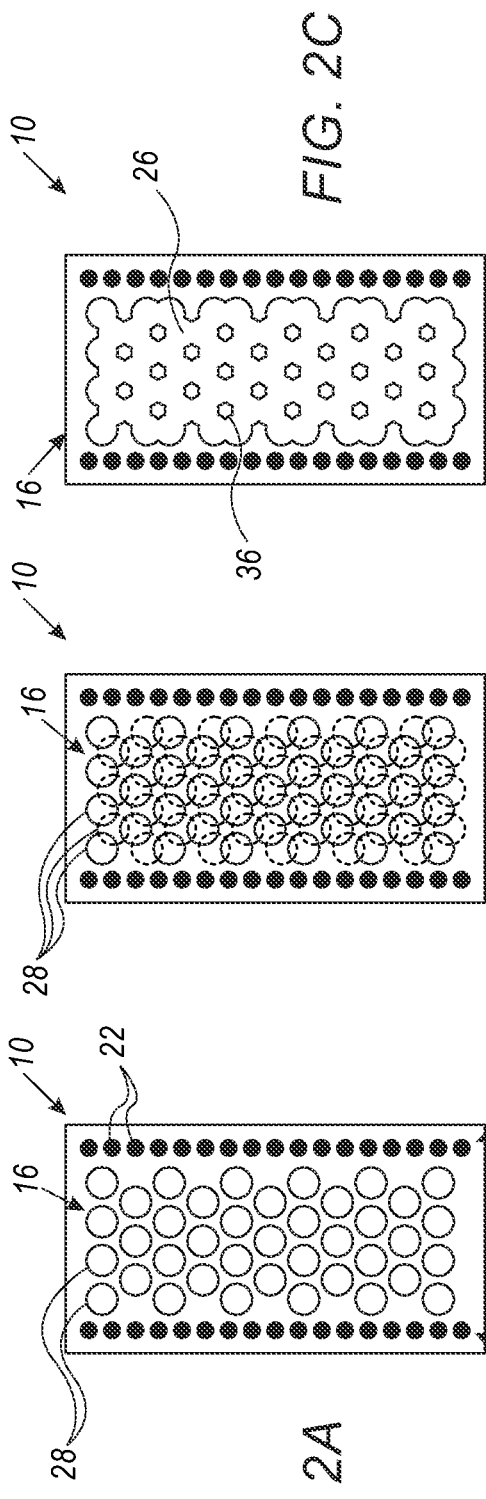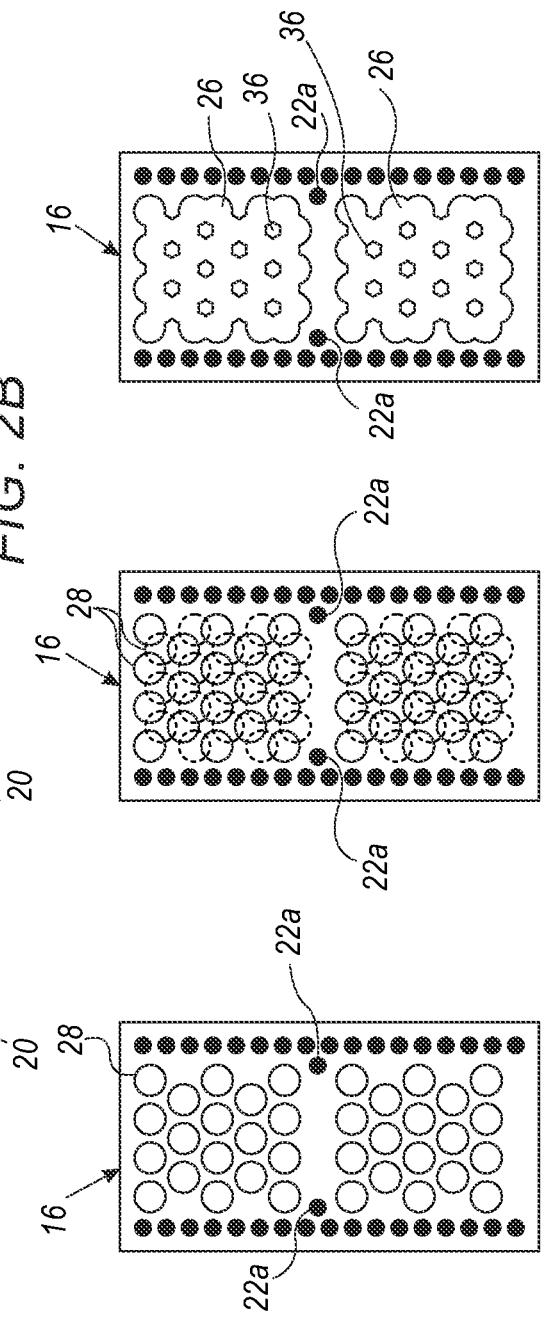

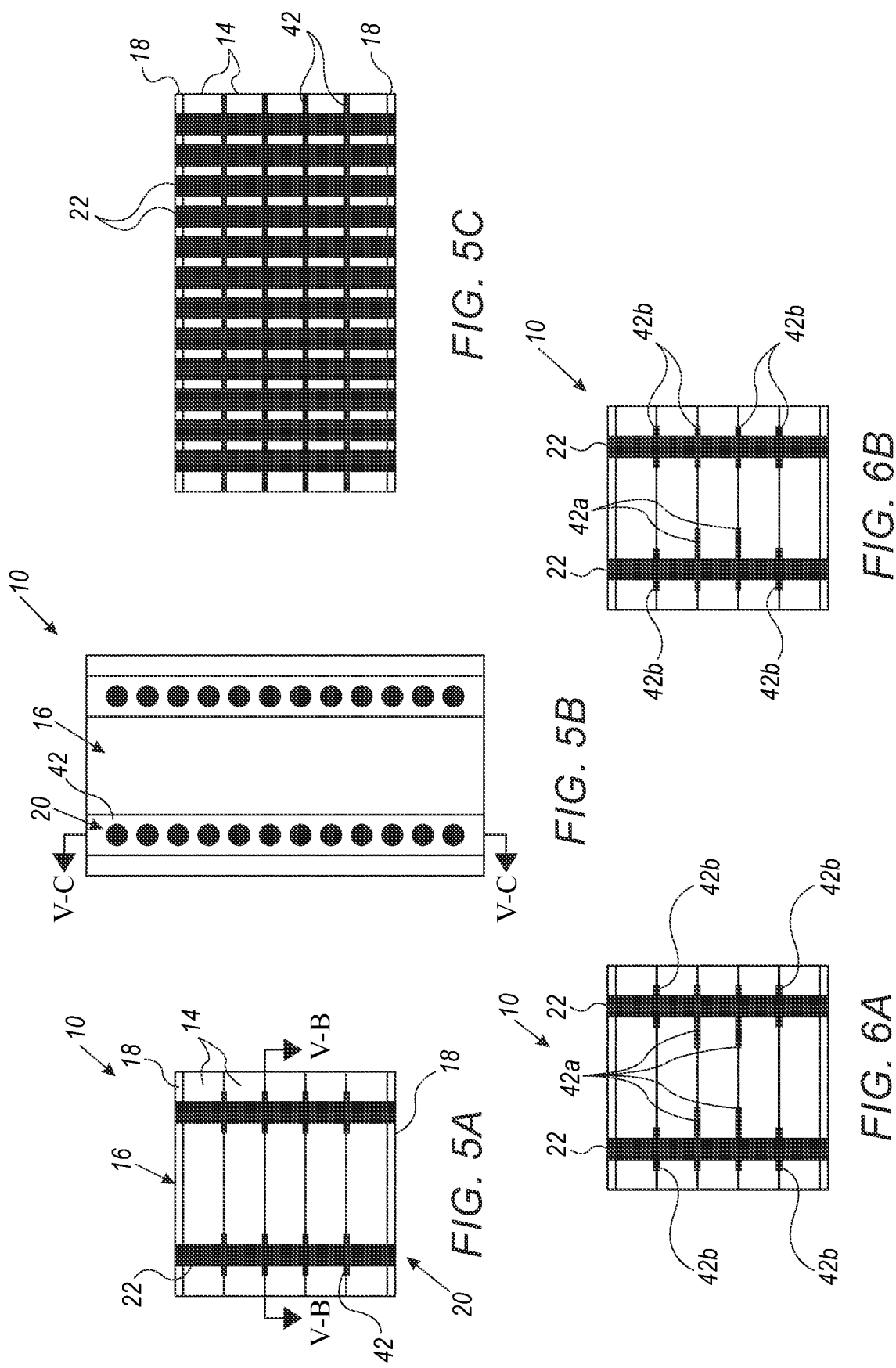

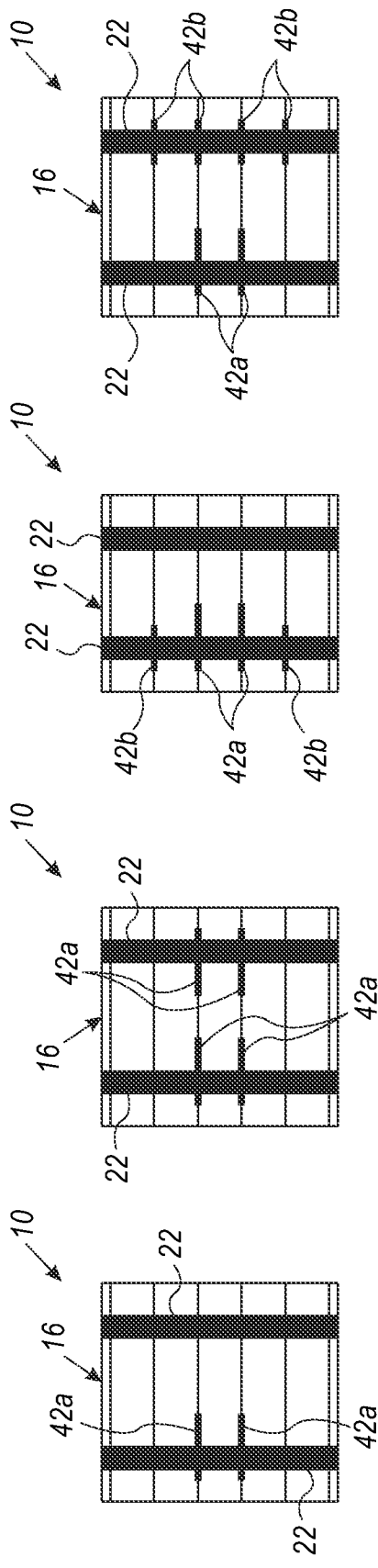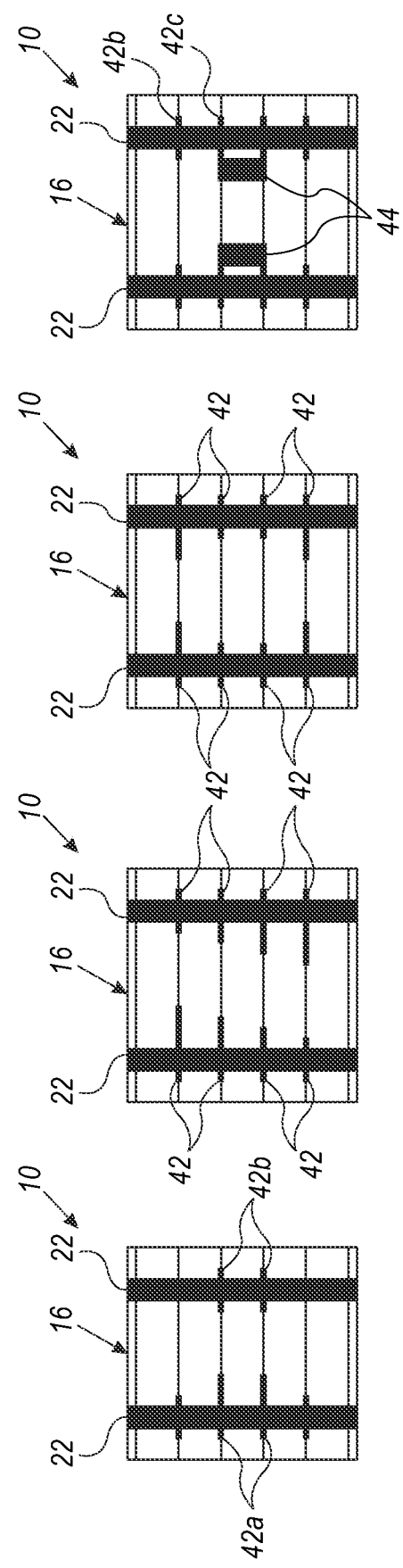

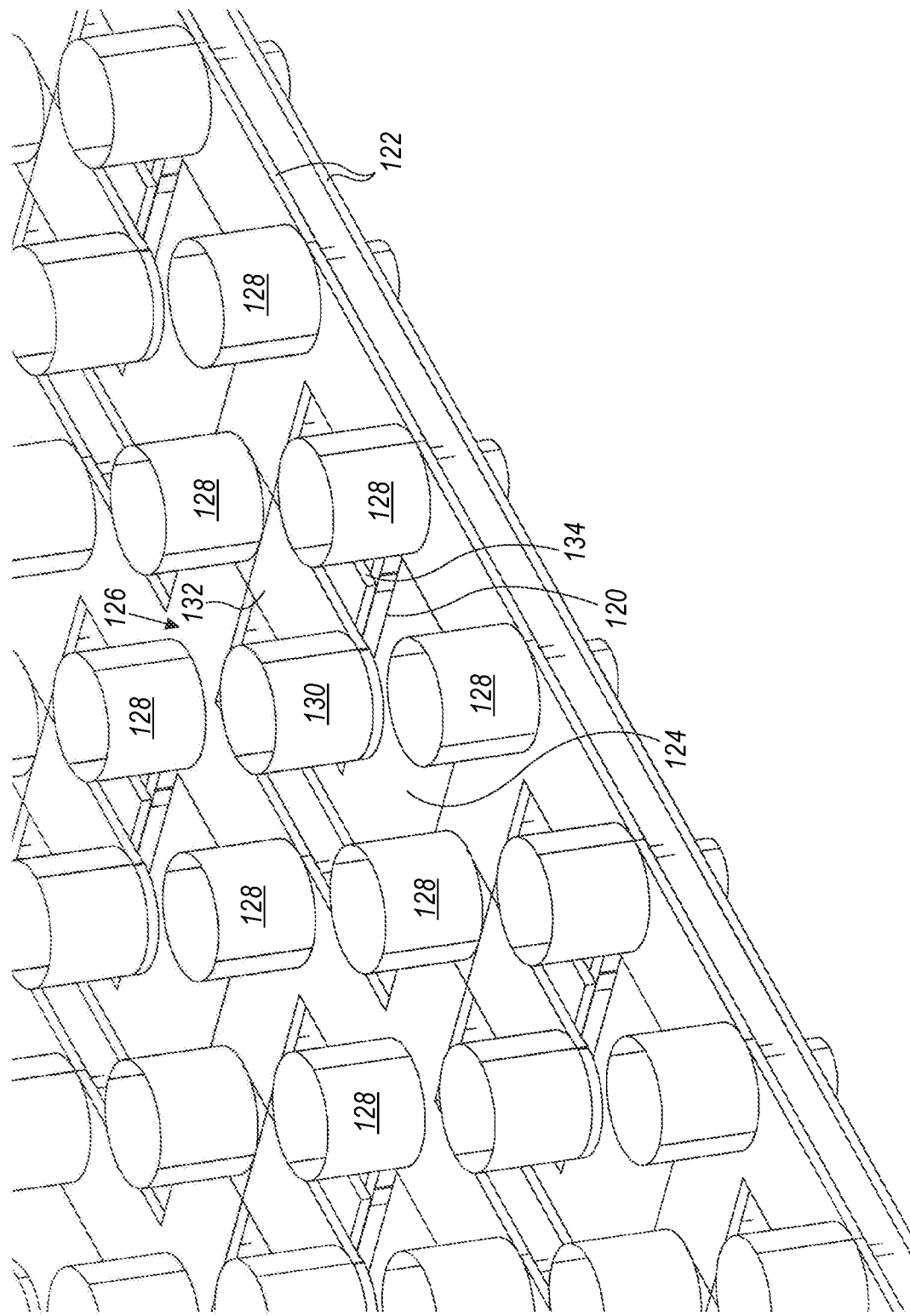

SUBSTRATE INTEGRATED WAVEGUIDE (SIW) INCLUDING FENCES WITH WALL STRIPS AND RIDGE STRIPS, WHERE THE RIDGE STRIPS EXTEND FURTHER INTO THE SIW THAN THE WALL STRIPS

CROSS REFERENCE TO RELATED APPLICATIONS

This application is a Continuation of U.S. patent application Ser. No. 17/347,649, filed on June 15, 2021 (now U.S. Pat. No. 11,450,937 issued on Sep. 20, 2022), and entitled "A PRINTED CIRCUIT BOARD INCLUDING A SUBSTRATE INTEGRATED WAVEGUIDE HAVING CHANNELS FORMED BY VERTICALLY OVERLAPPING CYLINDRICAL CAVITIES," and claims priority from Israel application Serial No. 279603, both of which are incorporated in their entirety herein by reference.

TECHNOLOGICAL FIELD

The presently disclosed subject matter relates to printed circuit boards, in particular to printed circuit boards comprising structures for transmission therethrough of guided electromagnetic waves, and to elements for introducing or extracting waves to/from such guiding structures.

BACKGROUND

In order to facilitate transmission of high-frequency electromagnetic signals through a printed circuit board, different structures may be incorporated. One such structure, termed as a "substrate integrated waveguide (SIW)," comprises two conductive fences spanning between top and bottom conductive ground planes. Each of the fences may comprise a row of vias, which are spaced apart so as to limit radiation leakage therethrough.

SUMMARY OF THE INVENTION

According to a first aspect of the presently disclosed subject matter, there is provided a printed circuit board comprising a horizontally extending dielectric substrate and a substrate integrated waveguide (SIW);

the SIW comprising two horizontally disposed conductive ground planes spaced by a vertical distance, and two vertically disposed conductive fences spanning therebetween, the fences extending in a first horizontal direction, and being spaced from one another in a second horizontal direction, perpendicular to the first horizontal direction;

wherein a space defined between the ground planes and the fences comprises material of the substrate formed with one or more channels being free of material of the substrate and extending in the first horizontal direction, each of the channels being formed by a plurality of vertical cylindrical cavities, each cavity horizontally overlapping one or more adjacent cavities.

Each of the cylindrical cavities may project from one of the ground planes a vertical distance which is less than the distance between the ground planes.

Each of the cylindrical cavities may project from one of the ground planes and horizontally overlap one or more adjacent cavities which project from the other of the ground planes.

Each of the cylindrical cavities, projecting from one of the ground planes, may overlap only adjacent cavities which project from the other of the ground planes.

The substrate may comprise a primary dielectric layer and at least one secondary dielectric layer being adjacent one of the ground planes, a first subset of the cylindrical cavities being formed in the primary dielectric layer and being at least partially bounded on at least one vertical side thereof by material of the secondary dielectric layer, the cavities of the first subset being spaced from one another, and a second subset of the cylindrical cavities being formed in the primary dielectric layer and in at least one secondary dielectric layer, each of the cavities of the second subset overlapping one or more cavities of the first subset.

The primary dielectric layer may comprise more than one sheet of dielectric material.

The secondary dielectric layer may comprise more than one sheet of dielectric material.

The printed circuit may comprise two of the secondary dielectric layers, each of the secondary dielectric layers being adjacent to a different one of the ground planes, wherein the cavities of the first subset are bounded on each vertical side by material of one of the secondary dielectric layers. wherein the cavities of the first subset are bounded on each vertical side by material of one of the secondary dielectric layers.

At least some of the cylindrical cavities may horizontally overlap two or more adjacent cavities, wherein the adjacent cavities are angularly spaced by 180°.

At least some of the cylindrical cavities may horizontally overlap three or more adjacent cavities, wherein the adjacent cavities are angularly spaced by 120°.

Each of the fences may comprise a plurality of vertically disposed conductive elements spaced from one another in the first horizontal direction.

The vertical distance (i.e., between the ground planes) may exceed, by at least a factor of two, the distance between the fences in the second horizontal direction, i.e., the SIW may be a vertical (H-plane) SIW.

The distance between the fences in the second horizontal direction may exceed, by at least a factor of two, the vertical distance (i.e., between the ground planes), i.e., the SIW may be a horizontal (E-plane) SIW.

According to a second aspect of the presently disclosed subject matter, there is provided a printed circuit board comprising a horizontally extending dielectric substrate and a SIW having at least one ridge;

the SIW comprising two horizontally disposed conductive ground planes spaced apart by a vertical distance, and two vertically disposed conductive fences spanning therebetween, the fences extending in a first horizontal direction, and being spaced apart from one another in a second horizontal direction, perpendicular to the first horizontal direction;

at least one of the fences comprising a plurality of horizontally disposed conductive strips vertically spaced from one another and extending in the first horizontal direction, at least some of the conductive strips being ridge-strips constituting the ridge and extending in the second horizontal direction toward the other of the fences.

At least some of the conductive strips may be wall-strips, the ridge-strips extending in the second horizontal direction to an extent greater than do the wall-strips.

The ridge-strips may be disposed vertically between wall-strips of the same fence.

Each of the fences may comprise a plurality of horizontally disposed conductive strips vertically spaced from one another and extending in the first horizontal direction, at least some of the conductive strips of each fence being ridge-strips constituting one of said ridges and extending in the second horizontal direction toward the other of the fences to an extent greater than other conductive strips being wall-strips of their respective fence.

Each ridge-strip may be disposed opposite a corresponding ridge-strip of the other fence.

The vertical distance between the ground planes may be greater than the distance in the second horizontal directed between the fences.

Each of the fences may comprise a plurality of vertically disposed conductive elements spaced from one another in the first horizontal direction.

The dielectric substrate may comprise a plurality of sheets of dielectric material, the strips being disposed between the sheets.

According to a third aspect of the presently disclosed subject matter, there is provided a printed circuit board comprising a horizontally extending dielectric substrate and a SIW having at least one ridge;

the SIW comprising two horizontally disposed conductive ground planes spaced apart by a vertical distance, and two vertically disposed conductive fences spanning therebetween, the fences extending in a first horizontal direction, and being spaced apart from one another in a second horizontal direction, perpendicular to the first horizontal direction;

the SIW further comprising a plurality of buried vias adjacent at least one of the fences on a side thereof facing the other of the fences, the buried vias constituting the at least one ridge.

The printed circuit board may further comprise at least one horizontally disposed conductive strip being a ridge-strip and extending in the first horizontal direction, the ridge-strip contacting at least one of the fences and at least some of the buried vias adjacent thereto.

According to a fourth aspect of the presently disclosed subject matter, there is provided a printed circuit board as described above in connection with the second and third aspects of the presently disclosed subject matter. According to a fifth aspect of the presently disclosed subject matter, there is provided a printed circuit board as described above in connection with the first and any one of the second, third, and fourth aspects of the presently disclosed subject matter.

According to a sixth aspect of the presently disclosed subject matter, there is provided a printed circuit board comprising a horizontally extending dielectric substrate and two or more SIWs;

each of the SIWs comprising two horizontally disposed conductive ground planes spaced apart by a vertical distance, and two vertically disposed conductive fences spanning therebetween, the fences extending in a first horizontal direction, and being spaced apart from one another in a second horizontal direction, perpendicular to the first horizontal direction;

wherein at least one of the fences constitutes a portion of two adjacent SIWs.

According to a seventh aspect of the presently disclosed subject matter, there is provided a printed circuit board as described above in connection with the sixth and the first, second, third, fourth, and/or fifth aspects of the presently disclosed subject matter.

According to an eighth aspect of the presently disclosed subject matter, there is provided a transduction assembly configured to facilitate transduction between at least one electrical signal and at least one electromagnetic wave, the transduction assembly comprising:

a transduction structure comprising one or more resonating units, each resonating unit comprising a resonator configured to be brought into electrical communication with at least one signal interface and to resonate at a frequency corresponding to an electrical signal applied thereto; and a waveguide structure comprising one or more SIWs each associated with one of the resonating units of the transduction structure and extending, at least in the vicinity of an associated resonating unit, in a first horizontal direction being perpendicular to a second horizontal direction, the waveguide structure being configured to facilitate transmissive coupling between the SIW and the resonator of the corresponding resonating unit.

The waveguide structure may comprise a slot associated with each of the SIWs, each of the slots extending in the first horizontal direction, the slot constituting an opening between the SIW and an associated resonating unit.

Each of the resonators may be disposed above and traverse a respective one of the slots.

The height of each of the SIWs in a vertical direction, being mutually perpendicular to the first and second horizontal directions, may exceed by at least a factor of two the width thereof in the second horizontal direction.

The transduction structure may comprise one or more dielectric frames each being formed with one or more openings defining the resonating units, each opening being disposed above a corresponding one of the slots.

The openings may be formed in at least two rows extending in the second horizontal direction, wherein the centers of the openings in one of the rows are offset from the centers of the openings in the other of the rows.

The openings may have a uniform width in the second horizontal direction, wherein the distance of the offset is half the width of the openings in the second horizontal direction.

Each of the resonating units may comprise a plurality of ground pins surrounding the opening.

At least some of the ground pins may be associated with two or more of the resonating units.

Each of the resonating units may comprise a signal pin configured for electrical connection to a corresponding one of the signal interfaces, the resonator bridging between the signal pin and one of the ground pins.

Each of the resonating units may further comprise an auxiliary resonator disposed between the resonator and the waveguide structure.

The auxiliary resonator may be formed as a cantilever.

The waveguide structure may be defined between two horizontal conductive ground planes.

The waveguide structure may comprise two or more conductive fences extending in the first horizontal direction, each of the fences being spaced from an adjacent fence in the second horizontal direction, thereby defining one of the SIWs therebetween.

Each of the fences may comprise a plurality of conductive vias spaced from one another in the first horizontal direction.

Each of the fences may further comprise one or more conductive strips extending in the first horizontal direction and bridging between the vias.

At least some of the SIWs may be formed with channels free of material of the transduction assembly.

Each of the SIWs may be formed with a backshort configured to block an electromagnetic wave from propagating therebeyond in the first horizontal direction.

At least some of the SIWs may comprise one or more waveguide irises therewithin.

The waveguide structure may comprise a printed circuit board as described above in connection with the first, second, third, fourth, fifth, and/or sixth aspects of the presently disclosed subject matter.

According to a ninth aspect of the presently disclosed subject matter, there is provided an antenna assembly configured to facilitate matching between at least one guided wave and at least one electromagnetic wave, the antenna assembly comprising:

top and bottom conductive ground planes;

one or more SIWs defined between the ground planes, each of the SIWs extending in a first horizontal direction being perpendicular to a second horizontal direction; and one or more resonating cavities, each connected to one of the SIWs and extending in the second horizontal direction, and each comprising a slot formed in one of the ground planes.

The height of each of the SIWs in a vertical direction, being mutually perpendicular to the first and second horizontal directions, may exceed by at least a factor of two the width thereof in the second horizontal direction.

The antenna assembly may further comprise one or more conductive sheets disposed between the top and bottom ground planes, the conductive sheets being formed with cutouts in the vicinities of the SIWs and resonating cavities.

Each of the resonating cavities may comprises a first portion vertically spaced from a respective slot, and a second portion adjacent to the respective slot, the second portion having a length in the second horizontal direction which is larger than the length of the first portion in the second horizontal direction.

The first portion of each of the resonating cavities may extend to one side of the respective SIW.

The second portion of each of the resonating cavities may extend to both sides of the respective SIW.

Each of the SIWs may be formed with a channel free of material of the antenna assembly.

Each of the resonating cavities may be formed with a channel free of material of the antenna assembly.

The antenna assembly may further comprise an auxiliary resonator connected with each of the SIWs and extending in the second horizontal direction.

Each of the auxiliary resonators may be being formed with a channel free of material of the antenna assembly.

The antenna assembly may comprise a printed circuit board as described above in connection with the first, second, third, fourth, fifth, and/or sixth aspects of the presently disclosed subject matter.

According to a tenth aspect of the presently disclosed subject matter, there is provided a transition structure comprising a transduction assembly according to the eighth aspect of the presently disclosed subject matter and an antenna assembly according to the ninth aspect of the presently disclosed subject matter.

SIWs of the transduction assembly may be connected to corresponding SIWs of the antenna assembly.

SIWs of the transduction assembly may each constitute a portion of a corresponding SIW of the antenna assembly.

BRIEF DESCRIPTION OF THE DRAWINGS

In order to better understand the subject matter that is disclosed herein and to exemplify how the subject matter may be carried out in practice, embodiments will now be described, by way of non-limiting example only, with reference to the accompanying drawings, where like features are depicted throughout the drawings and described throughout the specification by the same reference numbers, and in which:

FIG. 1A is a top view of an example of a printed circuit board (PCB) according to the presently disclosed subject matter;

FIG. 1B is a cross-sectional view taken along line IB-IB in FIG. 1A;

FIG. 1C is a cross-sectional view taken along line IC-IC in FIG. 1B;

FIG. 1D is a cross-sectional view taken along line ID-ID in FIG. 1A;

FIG. 2A is a top view of another example of a PCB according to the presently disclosed subject matter;

FIG. 2B is the top view of FIG. 2A, in which cavities formed from the bottom side of the PCB are indicated in broken lines;

FIG. 2C is a cross-sectional view of the PCB illustrated in FIG. 2A, taken along a plane parallel to the top plane thereof;

FIG. 3A is a top view of another example of a PCB according to the presently disclosed subject matter;

FIG. 3B is the top view of FIG. 3A, in which cavities formed from the bottom side of the PCB are indicated in broken lines;

FIG. 3C is a cross-sectional view of the PCB illustrated in FIG. 3A, taken along a plane parallel to the top plane thereof;

FIG. 5A is a side sectional view of another example of a PCB according to the presently disclosed subject matter;

FIG. 5B is a cross-sectional view taken along line VB-VB in FIG. 5A;

FIG. 5C is a cross-sectional view taken along line VC-VC in FIG. 5B;

FIGS. 6A, 6B, 6C, 6D, 6E, 6F, 6G, 6H, and 6I are side sectional views of modifications of the PCB illustrated in FIGS. 5A, 5B, and 5C;

FIG. 7 is a side sectional view of another example of a PCB according to the presently disclosed subject matter;

FIG. 8D is a closeup view of a transduction structure in the area indicated at D in FIG. 8A;

DETAILED DESCRIPTION OF THE INVENTION

Evacuated SIW: General

Figure 4B:
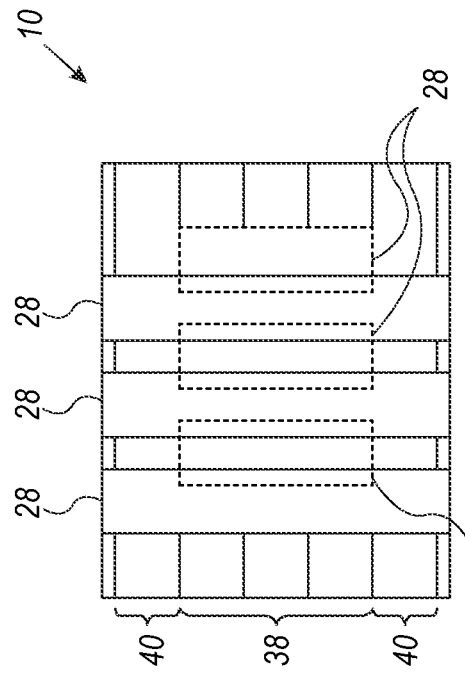
FIG. 4B is a cross-sectional view taken along line IV-IV in FIG. 4A.

As illustrated in FIGS. 1A, 1B, 1C, and 1D, there is provided a printed circuit board (PCB), a portion of which is illustrated, and which is generally indicated at 10. The PCB 10 is configured to support and selectively electrically connect and/or isolate various electronic components (not illustrated) mounted thereupon, for example as is known in the art. Accordingly, the printed circuit board comprises a dielectric substrate 12 defining a horizontal plane and being configured to carry the electronic components thereon, as well as conductive elements to connect therebetween. The substrate 12 may comprise a plurality of dielectric sheets 14.

Inter alia, the PCB 10 may comprise one or more transmission lines, such as a substrate integrated waveguide (SIW) 16, for example configured to facilitate propagation of high-frequency electromagnetic waves therethrough. Accordingly, the material of the substrate may be selected such that it allows transmission therethrough of electromagnetic radiation, albeit exhibiting some attenuation thereof.

It will be appreciated that herein the specification and appended claims, the terms "electromagnetic waves" may be used interchangeably with "guided wave." One having skill in the art will recognize that the usage of any particular term in a given context has been done for ease of description only, and is not meant to be limiting.

As best seen in FIGS. 1B and 1D, the SIW 16 comprises two horizontally disposed ground planes 18 made of a conductive material. The ground planes 18 are vertically spaced from one another, for example one being disposed above the substrate 12, and one being disposed therebelow. The SIW 16 further comprises two vertically disposed fences 20 made of a conductive material spanning between the ground planes 18. The fences 20 extend in a first horizontal direction and are spaced from one another in a second horizontal direction.

It will be appreciated that herein the disclosure and claims, terms relating to direction, such as "above," "below," "upper," "lower," etc., and similar/related terms are used with reference to the orientation in the accompanying drawings, unless indicated otherwise or clear from context, and is not to be construed as limiting.

Each fence 20 may comprise a plurality of conductive vias 22 extending vertically between the ground planes 18 and spaced from one another in the first horizontal direction. The distance between adjacent vias 22 is chosen to minimize radiation leakage therebetween, e.g., based on the diameters of the vias, the frequency of the signal which is intended to be propagated through the SIW 16, etc., for example as is well-known in the art.

According to some examples, the vertical distance between the ground planes 18 exceeds, for example by at least a factor of two, the distance in the second horizontal direction between the fences 20. Such an arrangement may constitute an H-plane waveguide, i.e., wherein the electric field of the electromagnetic wave propagated therethrough is parallel to the horizontal plane of the PCB 10.

The ground planes 18 and fences 20 define a space 24 therebetween, through which an electromagnetic wave may be guided. The space 24 comprises material of the substrate 12, formed with at least one channel 26 therewithin. The channel 26 is free of material of the substrate 12, for example being hollowed, evacuated, or filled with any suitable material, and extends substantially in the first horizontal direction, i.e., along the length of the SIW 16.

As best seen in FIG. 1C, the channel 26 is formed by a plurality of vertical cylindrical cavities 28, each cylindrical cavity horizontally overlapping one or more adjacent cavities. Each of the cavities 28 has a circular horizontal cross-section defined by one or more concyclic edges 30 about a centerpoint 32. As a clear (i.e., free of material of the substrate 12) path of the channel 26 in the first horizontal direction is defined by the radical lines segments defined by and contained within the overlapping circular cross-sections, the centerpoints 32 of the cavities 28 may be arranged along a straight line, i.e., each cavity overlaps two other cavities whose centerpoints are angularly spaced about the centerpoint thereof by 180°, for example parallel to the fences 20.

It will be appreciated that the descriptions in the specification and/or the appended claims regarding the relationship of one or more cavities 28 to those adjacent thereto, including, but not limited to, the number of overlapping adjacent cavities, do not necessarily apply to those cavities which are disposed on the perimeter of the channel 26. For example, according to the example described above with reference to and as illustrated in FIGS. 2A and 2B, the cavities 28 disposed on extreme positions along the first horizontal direction each overlap only one adjacent cavity. It will be readily appreciated that this applies, mutatis mutandis, to other examples described herein.

As best seen in FIG. 1C, being that the cavities 28 overlap, these cavities are not fully defined by a circular edge, and thus it will be understood that references herein, explicit and/or implicit, to the boundaries of a cavity 28 are to be construed as referring to the full circular outline which is defined by the extent edges thereof. Accordingly, e.g., descriptions herein of adjacent cavities overlapping one another are to be construed as referring to the areas within the full circular outlines thereof, for example as indicated at 28a, overlapping one another.

Evacuated SIW: Controlled-Depth Milling

According to some examples, in order to facilitate formation of the channel 26 while still maintaining sufficient structural integrity of the substrate 12, the cavities 28 may be formed using a controlled-depth milling procedure, i.e., each of the cavities 28 is milled such that it, i.e., the cavity, vertically projects from an open end 34 into the substrate 12 to a distance which is less than the vertical distance between the ground planes. The cavities 28 may thus be alternately formed, such that each is milled in a vertical direction which is opposite that direction in which cavities adjacent thereto are formed. Cavities 28 which are formed in the same direction, i.e., projecting into the substrate 12 with their open ends 34 facing the same direction and/or ground plane, do not overlap one another.

A channel 26 free of material of the substrate 12 may be formed as described above along any desired length of the SIW 16 while still maintaining material of the substrate bridging between the two side thereof. Similarly, the ground planes 18 maintain a conductive path between the two fences 20.

It will be appreciated that herein the specification and appended claims, the term "milling" and other related terms are used to indicate formation of a hole or bore using advancing a rotary cutting tool along an axis of rotation thereof to remove material, and are to be construed as including other similar technologies, including, but not limited to, drilling, etching, laser-cutting, etc., without being limited to technologies and/or methods which fall within the strict definition of "milling" as would be ordinarily used by one skilled in the relevant art.

Evacuated SIW: Honeycomb

According to other examples, for example as illustrated in FIGS. 2A, 2B, and 2C, the cavities 28 may be arranged such that the cavities formed in the same direction are arranged in a honeycomb pattern, i.e., wherein each cavity is surrounded by six other cavities such that the centerpoints of the six surrounding cavities are angularly spaced from one another by 60° about the centerpoint of the central cavity and are equally spaced therefrom. Moreover, the cavities 28 formed in the same direction do not overlap one another. The cavities 28 formed in the other direction (as indicated by broken lines in FIG. 2B) are similarly arranged, and disposed, e.g., such that the centerpoints of the cavities facing in one direction are disposed centrally between and equally spaced from centerpoints of three adjacent (i.e., defining an equilateral triangle) cavities facing in the other direction.

According to such examples, each cavity 28 overlaps three other cavities having centerpoints which are angularly spaced about the centerpoint thereof by 120°. Accordingly, for example as illustrated in FIG. 2C, the channel 26 is continuous along the length thereof, with posts 36 of material of the substrate 12 enclosed therewithin. In order to minimize dielectric losses, the sizes of the posts 36 may be minimized while still providing sufficient structural integrity to the substrate 12.

As illustrated in FIGS. 3A, 3B, and 3C, the SIW 16 may comprise more than one channel 26, each of the channels being separated by material of the substrate 12. According to some examples, an additional via 22a is provided between adjacent channels 26, each of the additional vias 22a being adjacent to one of the fences 20. It will be appreciated that while FIGS. 3A, 3B, and 3C, illustrate an example of an SIW 16 as described above with reference to and as illustrated in FIGS. 2A, 2B, and 2C, and comprising more than one channel 26 spaced in the first horizontal direction by material of the substrate 12, this is for illustrative purposes only; an SIW 16 according to any example described herein may comprises more than one channel 26 separated by material of the substrate 12 without departing from the scope of the presently disclosed subject matter, mutatis mutandis.

Evacuated SIW: Full-Depth Milling

Figure 4D:
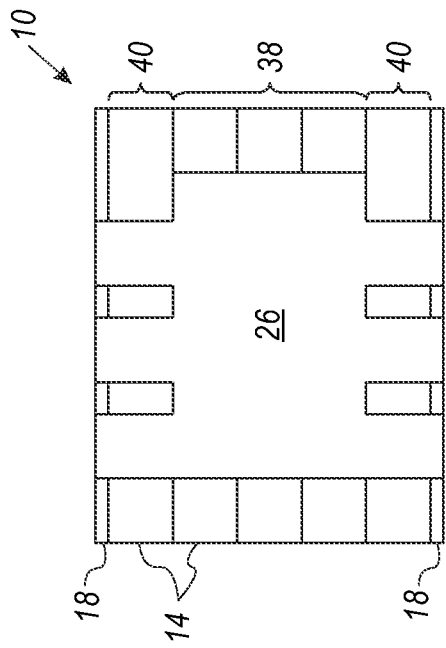
FIGS. 4C and 4D are cross-sectional views taken along line IV-IV in FIG. 4A, at different stages in the manufacture of the PCB illustrated therein.
Figure 4A:
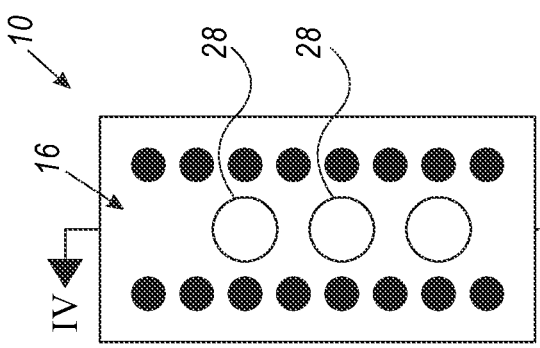
FIG. 4A is a top view of another example of a PCB according to the presently disclosed subject matter.

According to a modification, for example as illustrated in FIGS. 4A and 4B, the substrate 12 may comprise a primary dielectric layer 38 disposed between two secondary dielectric layers 40. Each of the primary dielectric layer 38 and secondary dielectric layer may comprise one or more dielectric sheets 14. The secondary layers 40 may each be adjacent one of the ground planes 18. According to some examples, each of the secondary dielectric layers 40 comprises a single dielectric sheet 14.

The channel 26 is formed by a plurality of horizontally overlapping vertical cylindrical cavities 28, for example as described above. However, according to the present modification, a first subset of the cavities 28 are formed only in the primary dielectric layer 38, i.e., they are bound on both vertical sides by the secondary dielectric layers 40, e.g., with no corresponding cavity formed therewithin, and a second subset of the cavities are formed passing through the entire substrate 12, i.e., through the primary dielectric layer and the secondary dielectric layers. Cavities 28 of each of the subsets do not intersect one another; they only intersect cavities of the other subset.

Figure 4C:
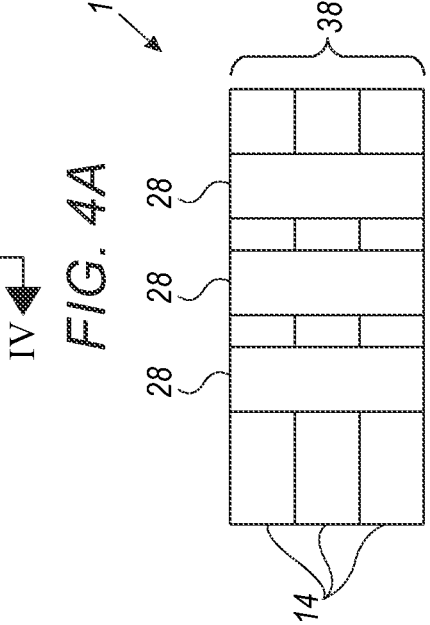

The arrangement described above with reference to and as illustrated in FIGS. 4A and 4B facilitates formation of the SIW 16 using a full depth milling procedure. For example, as illustrated in FIG. 4C, the cavities 28 of the first subset may be formed, prior to placement of the secondary dielectric layers, in the dielectric sheet or sheets 14 which constitute the primary dielectric layer 38. As the cavities 28 do not overlap, structural integrity is maintained. Moreover, as the cavities 28 of the first subset pass entirely through the primary dielectric layer 38, full depth milling may be used. Subsequently, as illustrated in FIG. 4D, the secondary dielectric layers 40 are attached to the primary dielectric layer 38, and the cavities 28 of the second subset are formed. (The locations of the cavities 28 formed in the primary dielectric layer 38 as described above with reference to and as illustrated in FIG. 4C are indicated in broken lines in FIG. 4D.) Similar to the cavities 28 of the first subset, as the cavities of the second subset do not overlap, structural integrity is maintained; moreover, the ground planes 28 may be applied before the cavities 28 are formed while still maintaining a conductive path between the two fences, for example as described above with respect to FIGS. 1A, 1B, 1C, and 1D, mutatis mutandis. As the cavities 28 of the second subset pass entirely through the primary and secondary dielectric layers 38, 40, full depth milling may be used.

It will be appreciated that while the modification described above with reference to and as illustrated in FIGS. 4A, 4B, 4C, and 4D is based on the example described above with reference to and as illustrated in FIGS. 1A, 1B, 1C, and 1D, it may be applied, mutatis mutandis, to any other channel 26 formed according to the presently disclosed subject matter within an SIW 16.

It will be further appreciated that while the modification described above with reference to and as illustrated in FIGS. 4A, 4B, 4C, and 4D comprises two secondary dielectric layers 40, a channel 26 may be similarly formed in a substrate comprising a single secondary dielectric layer, i.e., in which the primary dielectric layer 38 is adjacent one of the ground planes 18. Accordingly, the ground plane 18 adjacent the primary dielectric layer 38 may be attached thereto after formation of the first subset of cavities 28.

SIW Fence with Grid: General

As illustrated in FIGS. 5A, 5B, and 5C, one or both of the fences 20 may comprise a plurality of spaced apart vias 22 as described above, and may further comprise one more conductive strips 42 disposed substantially perpendicularly to the vias 22, i.e., extending in the first horizontal direction. The strips 42 are vertically spaced from other horizontally extending conductive elements, such as the ground planes 18 and/or other of the conductive strips 42. According to some examples, the dielectric substrate 12 comprises a plurality of dielectric sheets 14, wherein a conductive strip 42 is disposed between adjacent sheets. Accordingly, the fence 20 comprises a grid of spaced-apart vertical conductive elements, i.e., the vias 22, and spaced apart horizontal conductive elements, i.e., the strips 42. Such a structure may provide better protection against radiation leakage, for example compared to a fence comprising vias of the same diameter and similarly spaced, but without the strips.

Ridged SIW: SIW Fence with Grid

According to some examples, for example as illustrated in FIGS. 6A and 6B, one or more of the strips, indicated at 42a in the accompanying figures, constitute ridge-strips, and extend toward the other fence, e.g., as measured from a place defined by the centerlines of the vias 22, more than wall-strips 42b of the same fence 20. In particular, the ridge-strips 42a may be located centrally on the fence 20, such that the ridge-strips 42a are disposed between wall-strips 42b.

According to this arrangement, the SIW 16 may exhibit characteristics of a ridged waveguide, in which the ridge-strips 42a constitute the ridge.

It will be appreciated that the references to and/or description herein of "strips," for example accompanied by reference numeral 42, may apply as well to the ridge-strips 42a and wall-strips 42b, unless otherwise clear from context.

The strips may be arranged such that each strip 42 is disposed opposite (i.e., in the same horizontal plane) a corresponding strip in the other fence 20 of the SIW 16. As illustrated in FIG. 6A, each ridge-strip 42a is disposed opposite a corresponding ridge-strip of the other fence 20; such an SIW 16 may exhibit characteristics of a double-ridged waveguide. As illustrated in FIG. 6B, one of the fences 20 comprises only wall-strips 42b, and the other of the fences may comprise ridge-strips 42a located centrally thereon, i.e., with wall-strips 42b being provided above and below.

According to other examples, such as illustrated in FIG. 6C, 6D, 6E, 6F, and 6G, the configurations described above with reference to and as illustrated in FIGS. 6A and 6B may be modified such that one or both of the fences 20 does not comprise wall-strips 42b. According to some non-limiting examples:

- a single- or double-ridged waveguide may be provided in which only ridge-strips 42a are provided, without any wall-strips 42b (FIGS. 6C and 6D);
- a single-ridged waveguide may be provided in which one of the fences 20 comprises wall-strips 42a and the other does not (FIGS. 6E and 6F); and
- a double-ridged waveguide may be provided in which one fence 20 comprises ridge-strips 42a (and optionally comprises wall-strips 42b), and the other fence only includes wall-strips 42b disposed opposite the ridge-strips (FIG. 6G).

It will be further appreciated that the fences may comprise strips 42 which extend to different extents, thereby defining waveguides having non-rectangular cross-sections, for example as illustrated in FIGS. 6H and 6I.

Ridged SIW: Buried Vias

According to another example, for example as illustrated in FIG. 7, one or both of the fences 20 may comprise a plurality of conductive buried vias 44 disposed adjacent thereto on the side facing the other fence, and extending horizontally in the first direction, for example along the length of the SIW 16. According to this arrangement, the SIW 16 may exhibit characteristics of a ridged waveguide, in which the buried vias 44 constitute the ridge. One or both of the fences 20 may optionally comprise wall-strips 42b. Additionally or alternatively, one or more connecting strips 42c may be provided adjacent to and providing an electrical path between the buried vias 44, and/or between the buried vias 44 and the vias 22 constituting the rest of the fence.

It will be appreciated that although the buried vias 44 are illustrated in the accompanying figures each span a single sheet 14, buried vias of any size, for example spanning two or more sheets, may be provided without departing from the scope of the presently disclosed subject matter, mutatis mutandis.

SIW Fence with Grid: Miscellaneous

In addition, waveguides having non-rectangular cross-sections may be defined by combinations of blind vias (not illustrated) an/or buried vias, optionally with strips 42 connecting therebetween, similar to that described above with reference to and as illustrated in FIGS. 6H and 6I, mutatis mutandis.

It will be appreciated that one or more channels 26, for example as described above with reference to and as illustrated in FIGS. 1A, 1B, 1C, 1D, 2A, 2B, 2C, 3A, 3B, 3C, 4A, 4B, 4C, and 4D, may be formed in an SIW 16 as described above with reference to and as illustrated in FIGS. 5A, 5B, 5C, 6A, 6B, 6C, 6D, 6E, 6F, 6G, 6H, 6I, and 7, mutatis mutandis.

PCB Transduction Assembly

Figure 8A:
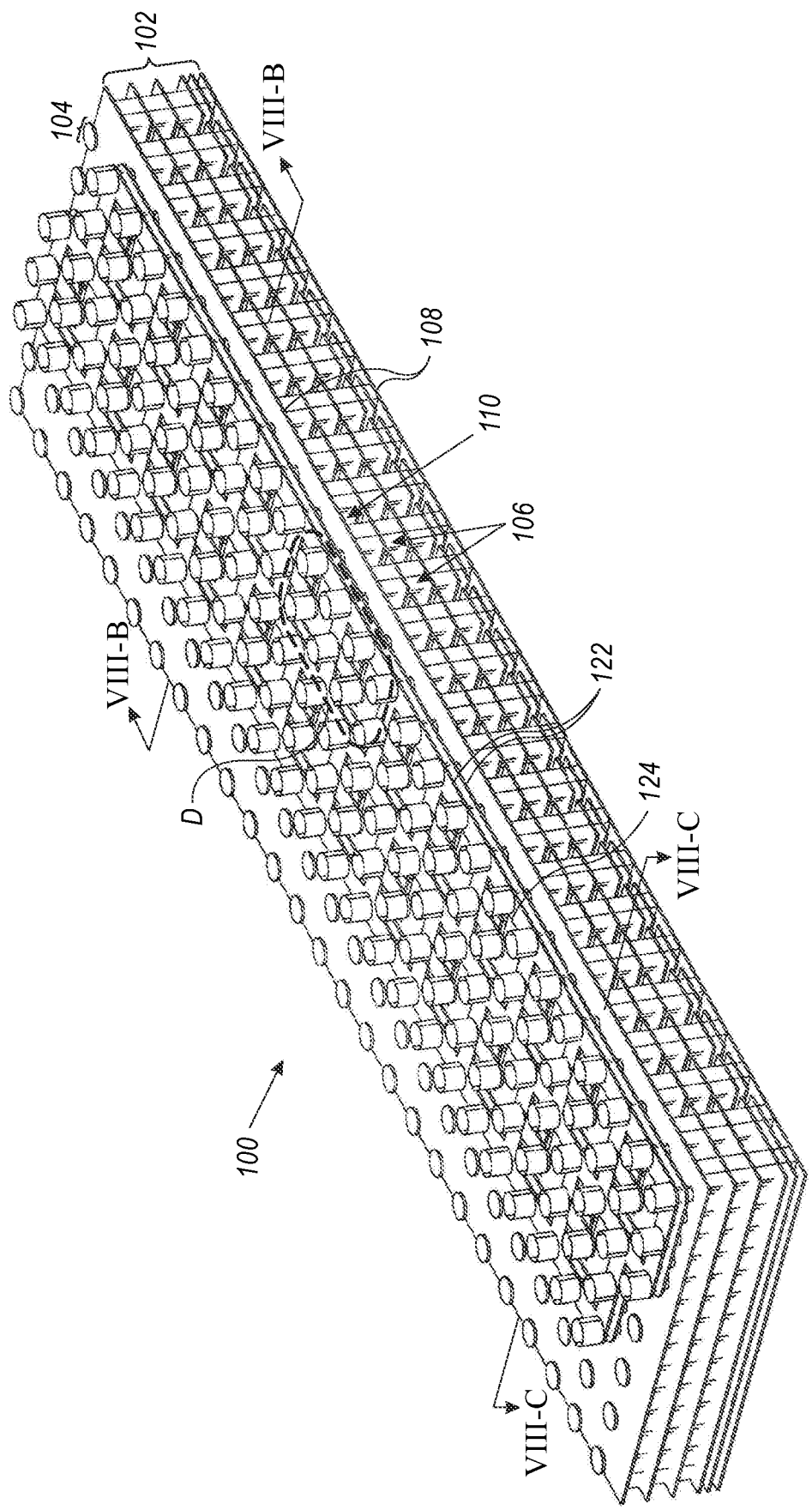
FIG. 8A is a perspective view of a PCB transduction assembly according to the presently disclosed subject matter.

As illustrated in FIG. 8A, there is provided a PCB transduction assembly, which is generally indicated at 100, comprising a waveguide structure 102 connected to a transduction structure 104 thereabove. The PCB transduction assembly 100 is configured for connection to a chip (for example a radio frequency integrated circuit; not illustrated), and to facilitate transduction of one or more electrical signals from the chip to one or more respective guided waves, e.g., electromagnetic waves, for propagation through the waveguide structure, and/or vice versa.

The waveguide structure 102 may be provided according to any suitable design. According to some examples, it comprises a plurality of conductive fences 106, each extending in a first horizontal direction, and spanning vertically between two conductive ground planes 108. An SIW 110 is defined in the space between adjacent fences 106.

One or more of the SIWs 110 may be provided in accordance with the description above with reference to and as illustrated in any one or more of FIGS. 1A, 1B, 1C, 1D, 2A, 2B, 2C, 3A, 3B, 3C, 4A, 4B, 4C, 4D, 5A, 5B, 5C, 6A, 6B, 6C, 6D, 6E, 6F, 6G, 6H, 6I, and 7, for example being formed with one or more channels free of material of the substrate, strips, etc., without departing from the scope of the presently disclosed subject matter, mutatis mutandis.

Figure 8B:
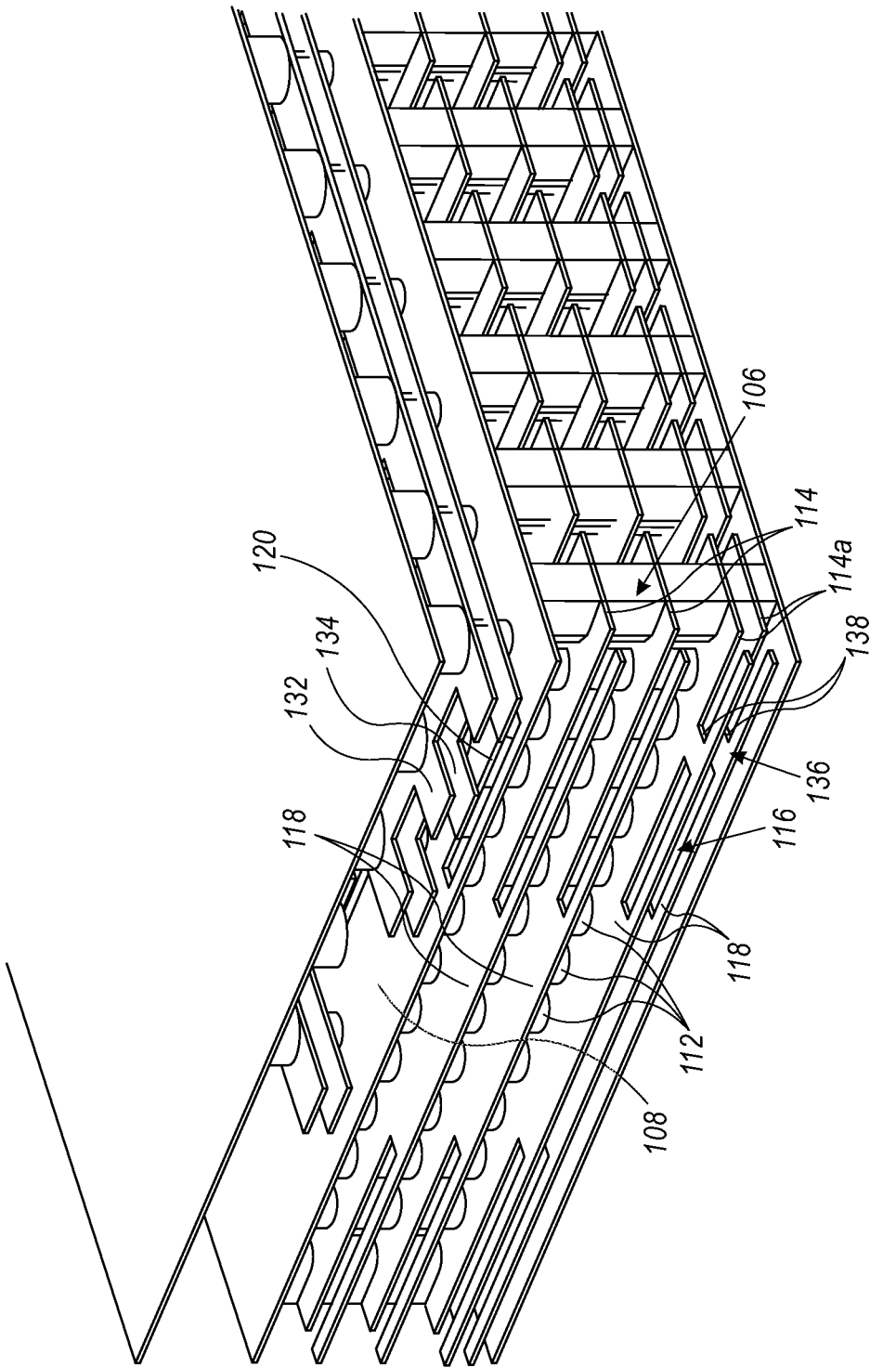
FIG. 8B is a cross-sectional view taken along line VIIIB-VIIIB in FIG. 8A.

As best seen in FIG. 8B, each of the fences 106 may comprise a plurality of conductive vias 112 extending vertically between the ground planes 108 and being spaced from one another in the first horizontal direction. The distance between adjacent vias 112 is chosen to minimize radiation leakage therebetween, e.g., based on the diameters of the vias, the frequency of the signal which is intended to be propagated through the SIW 110, etc., for example as is well-known in the art. One or more horizontally extending conductive strips 114 may be provided intersecting the vias 112, thereby forming a grid of conductive elements, for example as described above.

The fences 106 may be disposed such that the vertical distance between the ground planes 108 exceeds, for example by at least a factor of two, the distance between adjacent fences 106 in a second horizontal direction which is perpendicular to the first horizontal direction. As described above, such an arrangement may constitute an H-plane waveguide, i.e., wherein the electric field of the electromagnetic wave propagated therethrough is parallel to the horizontal plane of the PCB 100. It will be recognized that the fences 106 may be disposed such that the distance between adjacent fences in the second horizontal direction exceeds the vertical distance between the ground planes 108, for example constituting an E-plane waveguide, without departing from the scope of the presently disclosed subject matter, mutatis mutandis.

Each of the SIWs 110 may be further defined at one end along its length by a vertically extending conductive back-short 116 bridging between the fences 106. The backshort 116 may comprise a plurality of auxiliary strips 118, for example connected to the conductive strips 114 of the fences 106 or formed integrally with one or both of them. According to some examples (not illustrated) the backshort 116 may comprise a vertically extending via. The backshort 116 may function to ensure that waves within the SIW 100 does not propagate past the backshort.

Figure 8C:
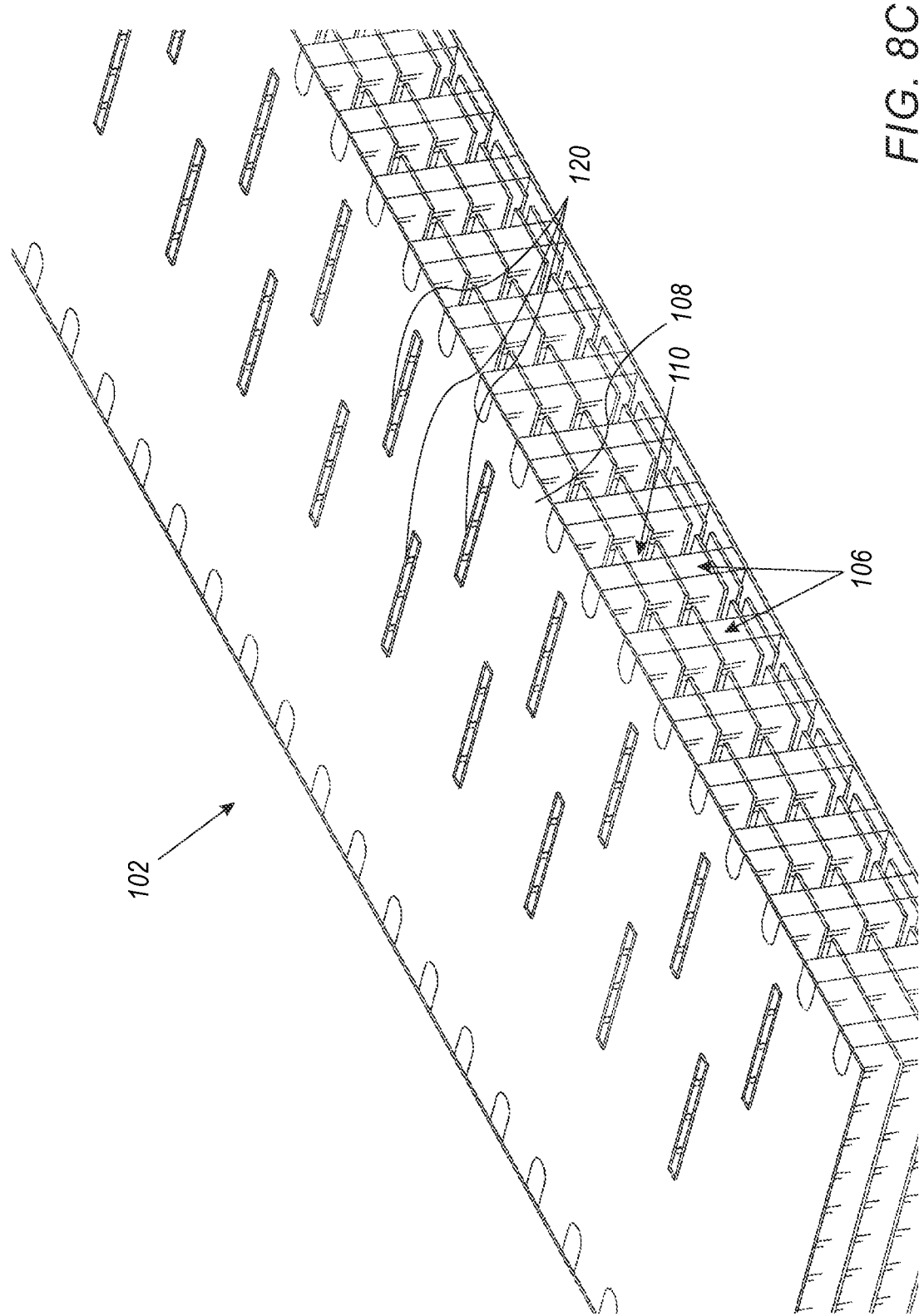
FIG. 8C is a perspective view, taken along line VIIIC-VIIIC in FIG. 8A, of a waveguide structure of the PCB transduction assembly illustrated in FIG. 8A.

As best seen in FIG. 8C, the waveguide structure 102 further comprises a plurality of slots 120 formed within the upper ground plane 108. The slots 120 may be elongate and extend in the first horizontal direction, i.e., parallel to the direction along which the respective SIW 110 extends. According to some examples, each of the slots 120 is disposed above an area of the respective SIW 110 which is adjacent a respective backshort 116. As will be explained hereinbelow, each of the slots 120 may function as an antenna facilitating introduction of an electromagnetic wave within the SIW 110 for propagation therethrough.

Reverting to FIG. 8B, each of the SIWs 110 may be provided with one or more waveguide irises 136 therein, thereby introducing a discontinuity therein. Each waveguide iris 136 may be designed for any suitable purpose, e.g., local blocking of a portion of the electromagnetic wave, filtering, etc. Each waveguide iris 136 may comprise one or more iris elements 138 spanning between oppositely disposed edges of one or more of the conductive strips 114 defining the SIW 110, for example near the bottom thereof. The iris elements 138 may be made of a conductive material, for example being formed as a single piece with a respective conductive strip. Each waveguide iris 136 may be disposed directly below the respective slot 120 associated with the SIW 110, for example entirely or partially. According to some examples, the length of the waveguide iris 136 in the first horizontal direction is less than the length of the respective slot 120 in the first horizontal direction. Lowermost conductive strips 114a, e.g., two of the lowermost conductive strips, may be spaced closer to each other than are conductive strips 114 which are not connected to iris elements 138. According to some examples, each of the SIWs 110 may comprise a waveguide iris 136 at any location therealong not directly below the respective slot 120, more than one waveguide iris, one or more waveguide irises located at the top of the SIW and/or at any other suitable height.

Reverting to FIG. 8A, the transduction structure 104 may comprise one or more dielectric frames 122, each comprising openings 124 lying in registration with the openings of the other frames of the transduction structure. Each of the openings 124 defines a resonating unit 126 (best illustrated in FIG. 8D) and is disposed above a corresponding slot 120 of the waveguide structure 102. Accordingly, each of the resonating units 126 of the transduction structure 104 is associated with one of the SIWs 110 of the waveguide structure, as will be explained hereinbelow.

According to some examples, such as illustrated in FIGS. 8A and 8D, the openings 124 are arranged in two rows, each extending in the second horizontal direction, i.e., perpendicular to the length of the SIWs 110, wherein the two rows are arranged such that the openings 124 of each row are offset from the openings of the other row, for example by half the center-to-center distance between adjacent openings 124.

Each of the resonating units 126 may be further defined by a plurality of ground pins 128 surrounding the opening 124. The ground pins extend down vertically to the upper ground plane 108 of the waveguide structure 102, for example being in electrical contact therewith. As illustrated in FIG. 8D, some of the ground pins 128 may be associated with adjacent resonating units 126.

Each of the resonating units 126 further comprises a signal pin 130, for example surrounded by the ground pins 128 associated therewith. The signal pin 130 does not extend down vertically to the upper ground plane 108 of the waveguide structure 102. A primary resonator 132 (FIG. 8B), for example a thin strip of a conductive material, is provided, bridging between the signal pin 130 and an associated one of the ground pins 128. The primary resonator 132 may be in the same horizontal plane as one of the dielectric frames 122 of the transduction structure 104, for example being formed therewith, and is disposed such that the primary resonator 132 passes above the slot 120 corresponding to its respective resonating unit 126, for example in a direction perpendicular thereto (i.e., in the second horizontal direction) and/or passing substantially above the center of its length.

Each of the resonating units 126 may further comprise an auxiliary resonator 134, for example disposed below the primary resonator 132, i.e., between the primary resonator and the corresponding slot 120. The auxiliary resonator 134 may function to facilitate transmission of a signal applied across the primary resonator 132 between the signal pin 130 and the associated ground pin 128, for example as in known in the art. Accordingly, the auxiliary resonator 134 may be connected to the associated ground pin 128. According to some examples, the auxiliary resonator 134 is disposed in the same horizontal plane as one of the dielectric frames 122 of the transduction structure 104, for example being formed therewith at one end. An opposite end of the auxiliary resonator 134 may be free, i.e., the auxiliary resonator may be formed as a cantilever attached at a fixed end thereof to the associated ground pin 128, with a free end thereof passing over the slot 120. According to some examples, the auxiliary resonator 134 passes completely over the slot 120.

In use, an electronic chip (not illustrated) may be mounted on the PCB transduction assembly 100. The chip comprises a plurality of signal interfaces, each aligned with and in electrical contact with one of the signal pins 130 when mounted on the PCB transduction assembly. In addition, one or more, e.g., all, of the ground pins 128 may share a common ground with the chip, for example via a ground interface thereof.

The chip may operate to cause an electromagnetic wave to form and propagate within a particular SIW 110, e.g., by producing an electrical signal, for example being a modulated signal and/or characterized by one or more frequencies, at one of its signal interfaces of the chip. As each of the primary resonators 132 lies on the electrical path between a respective signal pin 130 and ground pins 128, the primary resonator of a corresponding resonating unit 126 of the transduction structure 104 resonates correspondingly thereto, e.g., being similarly modulated, resonating at a corresponding frequency, etc. Consequently, electrical currents are induced, inter alia, around the respective slot 120, thereby producing an electromagnetic wave in the SIW 110 corresponding to the electronic signal.

Similarly, electromagnetic waves which are introduced into the SIW 110, for example at an opposite end thereof, induce electrical currents around the respective slot 120, thereby producing an electric signal in the primary resonator 132 in electrical communication with the signal interface of the chip, thereby facilitating transmitting thereto signals encoded in electromagnetic waves.

Accordingly, the slot 120 is configured to facilitate transmissive coupling between the SIW 110 and the primary resonator 132 (and by extension the signal pin 130), i.e., to give rise to an electromagnetic wave within the SIW being characterized by a signal carried in an electrical signal in the signal pin for example by way of the primary resonator, and to give rise to an electrical signal in the signal pin for example by way of the primary resonator being characterized by a signal carried in an electromagnetic wave within the SIW.

It will be appreciated that while the PCB transduction assembly 100 described above with reference to and as illustrated in FIGS. 8A, 8B, 8C, and 8D comprises a waveguide structure 102 having a plurality of SIWs 110 and corresponding resonating units 126, this is by way of example only, and a PCB transduction assembly may be provided having a single SIW and corresponding resonating unit without departing from the scope of the presently disclosed subject matter, mutatis mutandis.

It will be further appreciated that while the PCB transduction assembly 100 is described herein as being configured for connection to a chip, this is not to be seen as limiting. In practice, the PCB transduction assembly may be configured for connection, e.g., via the signal pin 130 to any suitable external component constituting a signal interface, including, but not limited to, an external antenna, a transmission line such as a microstrip or stripline, to any suitable resonant transmission line segment for coupling to an external component, etc., mutatis mutandis.

In addition, it will be recognized that the PCB transduction assembly 100 is described herein with reference to and as illustrated in FIGS. 8A, 8B, 8C, and 8D by way of example only, and that one having skill in the art will recognize that suitable modifications may be made thereto without departing from the scope of the presently disclosed subject matter, mutatis mutandis. For example, each of the SIWs 110 may be formed with two or more slots 120. Several SIWs 110 may be associated with a single resonating unit 126, for example to facilitate propagation of similar electromagnetic waves within different SIWs based on a single electrical signal, and/or to facilitate receipt by a single signal interface of signals encoded in electromagnetic waves from different sources.

Moreover, it will be recognized that the waveguide structure 102 as described above with reference to and as illustrated in the FIGS. 8A, 8B, 8C, and 8D comprises a plurality of SIWs 110, each defined between two fences 106, at least some of which constitute a fence associated with adjacent SIWs, i.e., adjacent SIWs may share a common fence. While this feature has been described an illustrated in connection with the specific example of the waveguide structure 102 of the PCB transduction assembly 100, adjacent SIWs which share a common fence, i.e., a single fence constituting a portion of more than one SIW, may be provided on any suitable printed circuit board without departing from the scope of the presently disclosed subject matter, mutatis mutandis.

PCB Antenna Assembly

As illustrated in FIGS. 9A through 9D, there is provided a PCB antenna assembly, which is generally indicated at 200. The PCB antenna assembly 200 may be configured for facilitating matching between a wave in an SIW a corresponding electromagnetic wave, and/or vice versa, i.e., the PCB antenna assembly may be configured to facilitate producing a guided wave corresponding an external electromagnetic wave, and/or vice versa.

The PCB antenna assembly 200 may be provided according to any suitable design. According to some examples, the PCB antenna assembly 200 comprises a plurality of conductive fences 206 (indicated in FIGS. 9B and 9D), each extending in a first horizontal direction, and spanning vertically between two conductive ground planes 208. An SIW 210 is defined in the space between adjacent fences 206.

One or more of the SIWs 210 may be provided in accordance with the description above with reference to and as illustrated in any one or more of FIGS. 1A, 1B, 1C, 1D, 2A, 2B, 2C, 3A, 3B, 3C, 4A, 4B, 4C, 4D, 5A, 5B, 5C, 6A, 6B, 6C, 6D, 6E, 6F, 6G, 6H, 6I, and 7, for example being formed with one or more channels free of material of the substrate, strips, etc., without departing from the scope of the presently disclosed subject matter, mutatis mutandis.

Figure 9A:
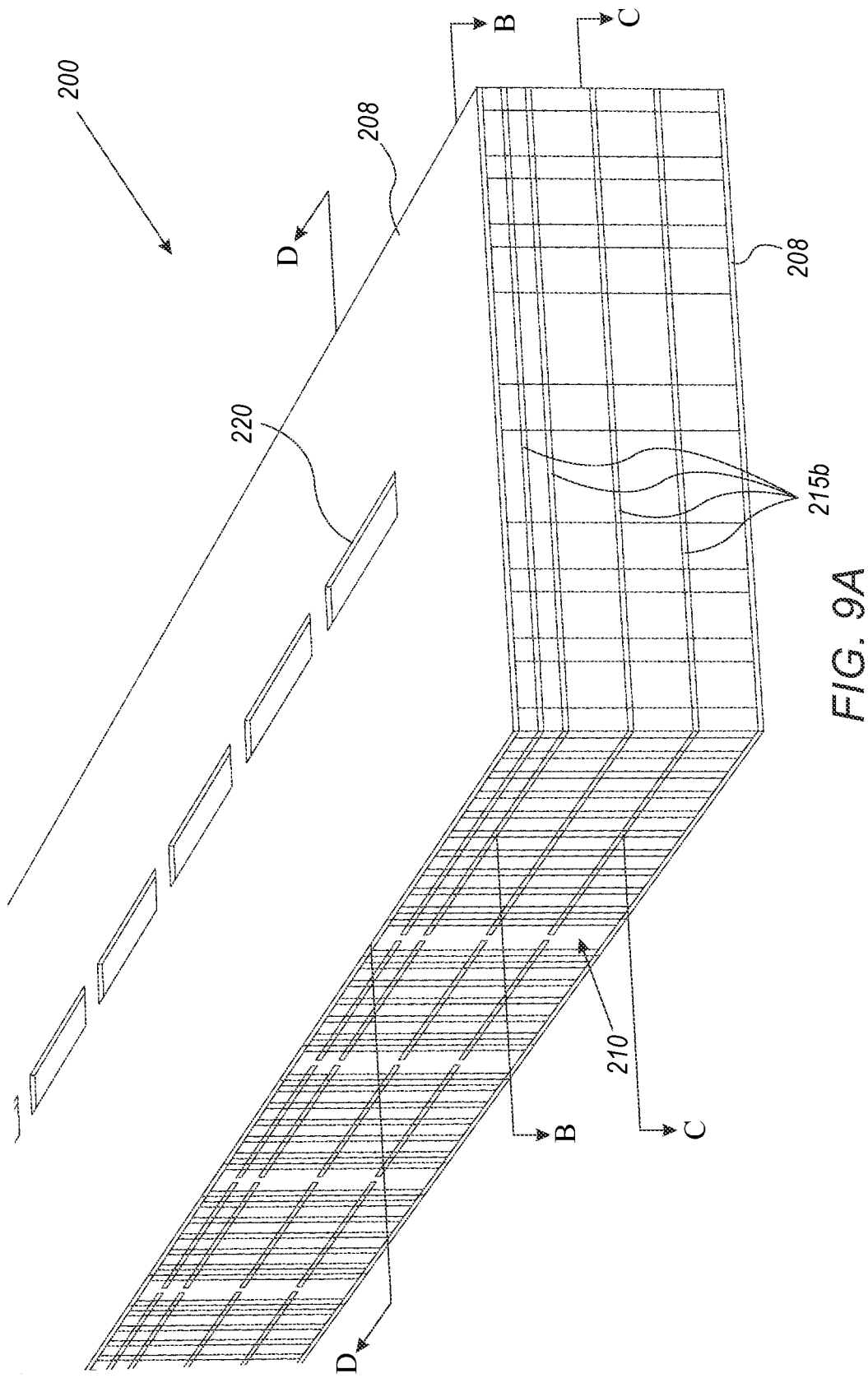
FIG. 9A is a perspective view of a PCB antenna assembly according to the presently disclosed subject matter.
Figure 9B:
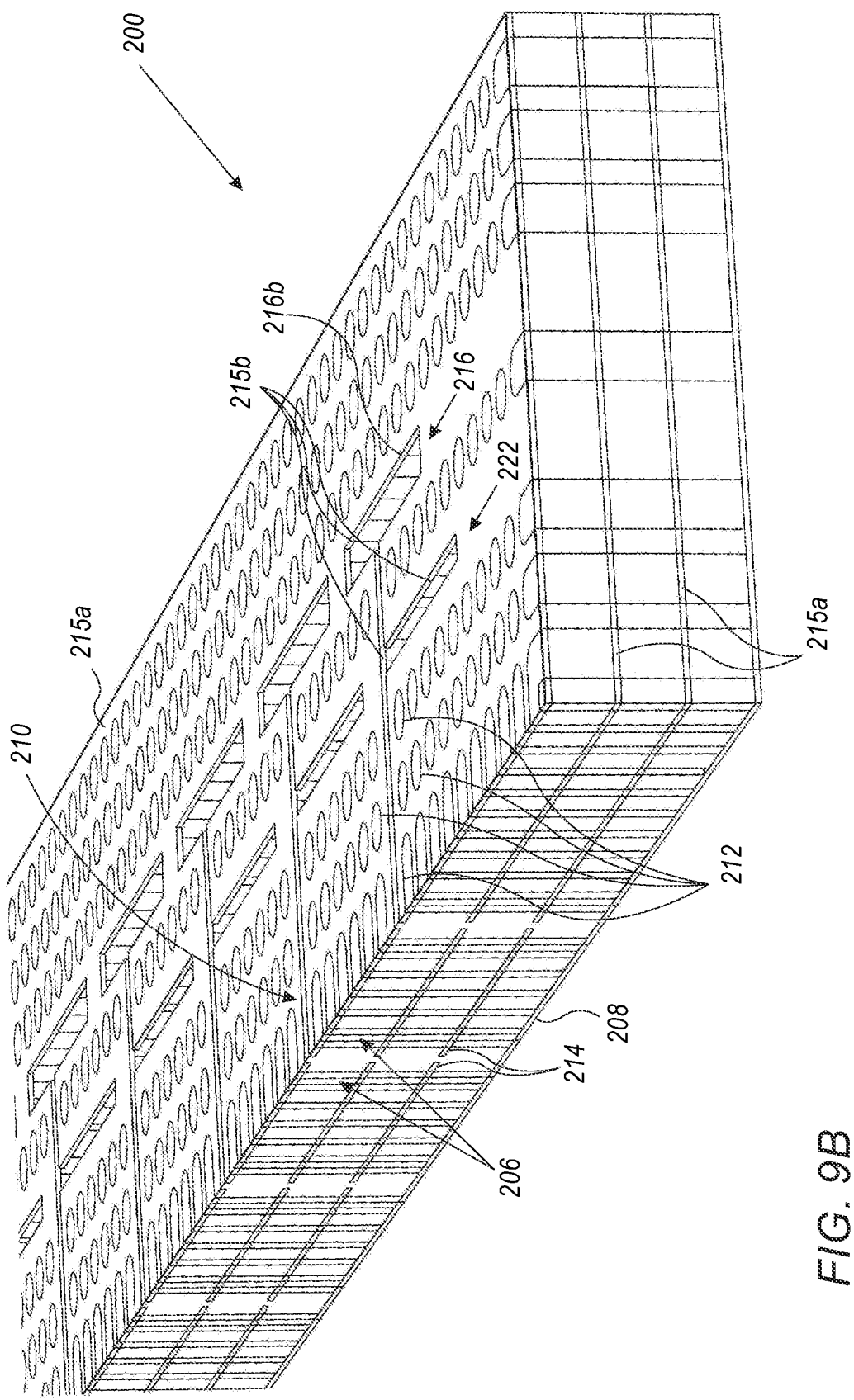
FIG. 9B is a cross-sectional view taken along line B-B in FIG. 9A.

As illustrated in FIG. 9B, each of the fences 206 may comprise a plurality of conductive vias 212 extending vertically between the ground planes 208 and being spaced from one another in the first horizontal direction. The distance between adjacent vias 212 is chosen to minimize radiation leakage therebetween, e.g., based on the diameters of the vias, the frequency of the signal which is intended to be propagated through the SIW 210, etc., for example as is well-known in the art. One or more horizontally extending conductive strips 214 may be provided intersecting the vias 212, thereby forming a grid of conductive elements, for example as described above.

Figure 9C:
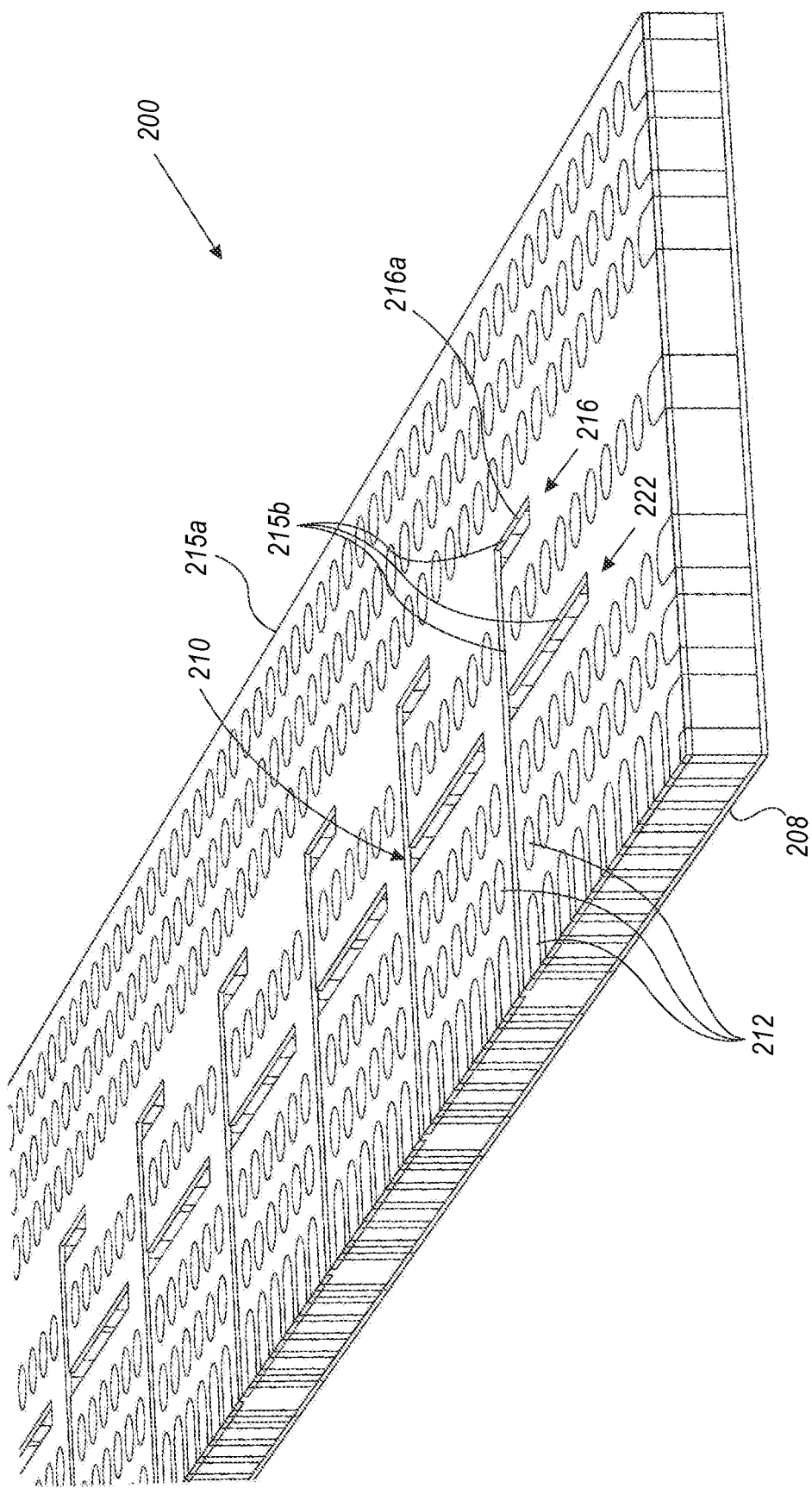
FIG. 9C is a cross-sectional view taken along line C-C in FIG. 9A.

It will be appreciated that while according to some examples, for example as illustrated in FIGS. 9B and 9C, one, several, or all of the conductive strips 214 in the same horizontal plane, e.g., associated with more than one of the SIWs 210, may constitute part of a larger sheet 215a of conductive material, e.g., extending in a direction opposite the SIW, for example formed with cutouts 215b, as the presently disclosed subject matter is concerned with the portion of the conductive material intersecting the vias 212 and in the vicinity of the vias, the term "strip" is used. However, this is not to be construed as limiting to examples in which some or all of the strips are part of a larger element, in particular wherein none of the elements referred to as "strips" would otherwise be so referred to, mutatis mutandis. It will be further appreciated that other elements described herein the present disclosure and appended claims as "strips" may similarly constitute part of a larger sheet of conductive material, mutatis mutandis.

The fences 206 may be disposed such that the vertical distance between the ground planes 208 exceeds, for example by at least a factor of two, the distance between adjacent fences 206 in a second horizontal direction which is perpendicular to the first horizontal direction. As described above, such an arrangement may constitute an H-plane waveguide, i.e., wherein the electric field of the electromagnetic wave propagated therethrough is parallel to the horizontal plane of the PCB antenna assembly 200. It will be recognized that the fences 206 may be disposed such that the distance between adjacent fences in the second horizontal direction exceeds the vertical distance between the ground planes 208, for example constituting an E-plane waveguide, without departing from the scope of the presently disclosed subject matter, mutatis mutandis.

Each of the SIWs 210 may be further defined at one end along its length by a resonating cavity 216, for example extending in the second horizontal direction, i.e., perpendicular to the horizontal direction along which the SIW 210 extends.

Figure 9D:
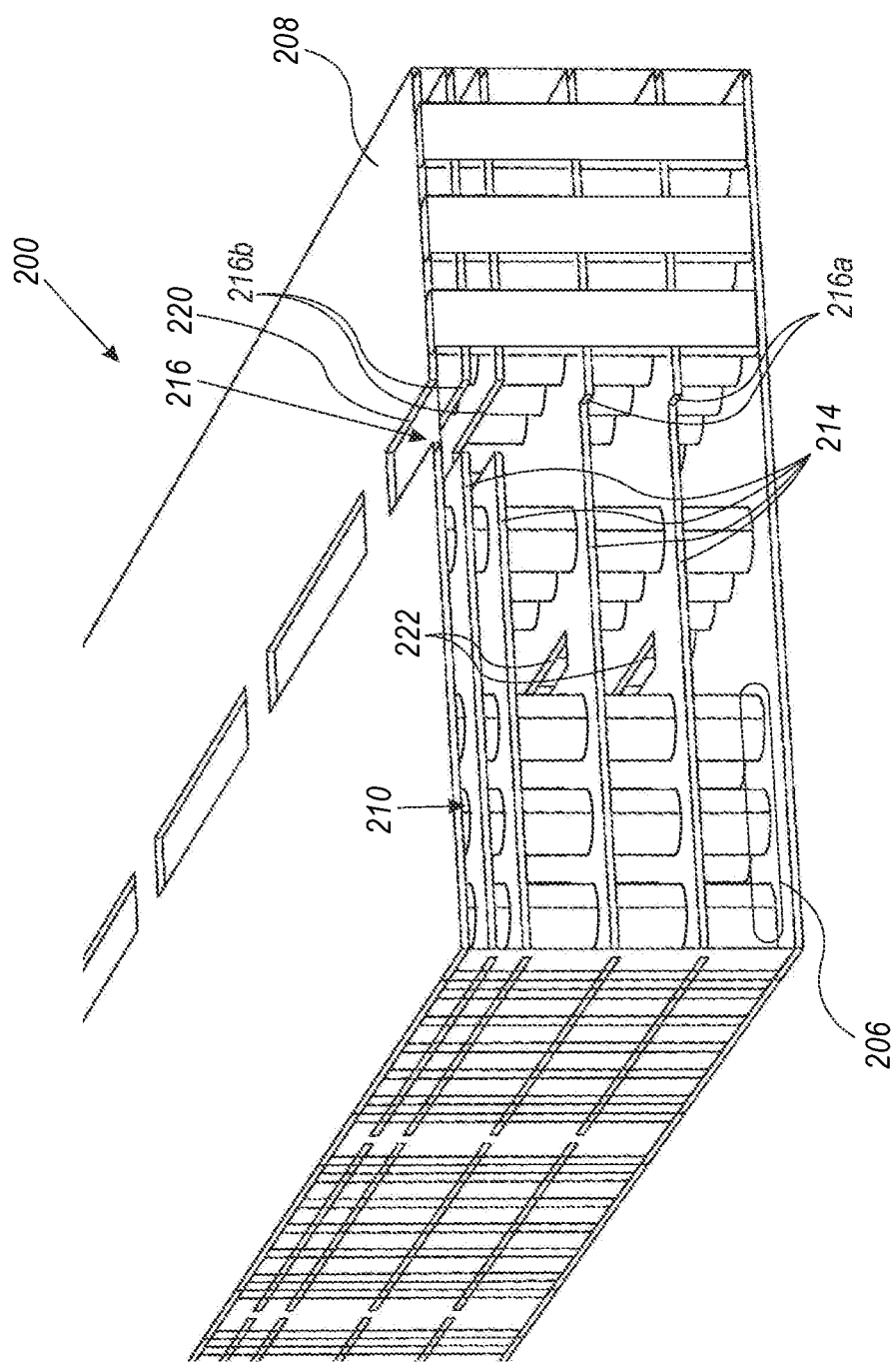
FIG. 9D is a cross-sectional view taken along line D-D in FIG. 9A.

As seen in FIGS. 9B, 9C, and 9D, the resonating cavity 216 may comprise a lower portion 216a (FIGS. 9C and 9D), and an upper portion 216b (FIG. 9D) including a slot 220 (FIG. 9D) formed in the upper ground plane 208 and being longer than the lower portion 216a. According to some examples, the lower portion 216a extends from the respective SIW 210 of the lower portion 216a in one horizontal direction, i.e., the lower portion and the respective SIW of the lower portion together form an L-shape, with the upper portion 216b extending from the SIW in both directions, i.e., the lower portion and the SIW together form a T-shape. In use, a standing wave develops in the resonating cavity 216, corresponding to the frequency of the guided wave within the SIW 210, and a corresponding electromagnetic wave exits through the slot 220. A substantially reverse process happens when an electromagnetic wave is introduced to the resonating cavity 216 via the slot 220, i.e., resulting in a guided wave in the SIW 210 corresponding to the frequency of the electromagnetic wave.

According to some examples, e.g., as illustrated in FIGS. 9B through 9D, the PCB antenna assembly 200 may comprise an auxiliary resonator 222, for example configured to facilitate broadband matching. The auxiliary resonator 222 may extend in the second horizontal direction, i.e., perpendicular to the SIW 210. According to some examples (e.g., as illustrated in FIGS. 9A through 9D), the auxiliary resonator 222 extends in the same direction as does the lower portion 216a of the resonating cavity 216; according to other examples (not illustrated), it extends in the opposite direction thereto.

Transition Structure

According to some examples, a transition structure for introducing an electromagnetic signal into or from a SIW may comprise PCB transduction assembly 100 as described above with reference to and illustrated in FIGS. 8A, 8B, 8C, and 8D and the PCB antenna assembly 200 as described above with reference to and illustrated in FIGS.

9A, 9B, 9C, and 9D. In such a transition structure, some or each of the SIWs 110 of the PCB transduction assembly 100 are connected to and/or constitute at least of portion of a corresponding SIW 210 of the PCB antenna assembly 200.

Accordingly, a chip (not illustrated) mounted on the PCB transduction assembly 100 of the transition structure such that signal interfaces thereof are in electrical contact with corresponding signal pins 130 (as described above with reference to and as illustrated in FIG. 8D) may be operated to cause a wave to form and propagate within a particular SIW 110, for example as described above with reference to and as illustrated in FIGS. 8A through 8D, which continues within a corresponding SIW 210 of the PCB antenna assembly 200, for example as described above with reference to and as illustrated in FIGS. 9A through 9D, and exit as an electromagnetic wave from the slot 220. It will be appreciated that the reverse is true as well, i.e., an electromagnetic wave entering the PCB antenna assembly 200 of the transition structure via the slot 220 may be directed in the reverse direction and produce an electric signal in the primary resonator 132 of the PCB transduction assembly 100.

Those skilled in the art to which this invention pertains will readily appreciate that numerous changes, variations, and modifications can be made without departing from the scope of the presently disclosed subject matter, mutatis mutandis.

The invention claimed is:

1. A printed circuit board comprising a horizontally extending dielectric substrate and a substrate integrated waveguide (SIW) having at least one ridge;
    said SIW comprising first and second horizontally disposed conductive ground planes spaced by a vertical distance, and two vertically disposed conductive fences spanning therebetween, said fences extending in a first horizontal direction, and being spaced from one another in a second horizontal direction, perpendicular to the first horizontal direction;
    at least one of said fences comprising a plurality of horizontally disposed conductive strips vertically spaced from one another and extending in the first horizontal direction, at least some of said conductive strips being wall-strips, and at least some of said conductive strips being ridge-strips constituting at least a portion of said at least one ridge and extending from their respective fences in the second horizontal direction toward the other of said fences to an extent greater than said wall-strips.

2. A printed circuit board according to claim 1, comprising two or more of said SIWs, wherein at least one of the fences constitutes a portion of two adjacent SIWs.

3. The printed circuit board according to claim 1, wherein said ridge-strips are vertically disposed between wall-strips of the same fence.

4. The printed circuit board according to claim 1, wherein each of said fences comprises a plurality of horizontally disposed conductive strips vertically spaced from one another and extending in the first horizontal direction, at least some of said conductive strips of each fence being ridge-strips constituting one of said at least one ridges and extending in the second horizontal direction toward the other of said fences.

5. The printed circuit board according to claim 4, wherein each ridge-strip is disposed opposite a corresponding ridge-strip of the other of said fences.

6. The printed circuit board according to claim 1, wherein the vertical distance between said first and the second ground planes is greater than the distance in the second horizontal direction between said fences.

7. The printed circuit board according to claim 1, wherein each of said fences comprises a plurality of vertically disposed conductive elements spaced from one another in the first horizontal direction.

8. The printed circuit board according to claim 1, said dielectric substrate comprising a plurality of sheets of dielectric material, said strips being disposed between said sheets.

9. A printed circuit board according to claim 1, said at least one ridge further comprising a plurality of buried vias adjacent at least one of said fences on a side thereof facing the other of said fences.

10. The printed circuit board according to claim 9, the ridge-strip contacting at least one of said fences and at least some of said buried vias adjacent thereto.

* * * * *